(12) United States Patent
Zhang et al.

(10) Patent No.: US 11,429,009 B2
(45) Date of Patent: Aug. 30, 2022

(54) INTEGRATED ELECTRO-OPTIC DEVICES FOR CLASSICAL AND QUANTUM MICROWAVE PHOTONICS

(71) Applicant: President and Fellows of Harvard College, Cambridge, MA (US)

(72) Inventors: Mian Zhang, Cambridge, MA (US); Marko Loncar, Cambridge, MA (US); Cheng Wang, Cambridge, MA (US)

(73) Assignee: President and Fellows of Harvard College, Cambridge, MA (US)

( * ) Notice: Subject to any disclaimer, the term of this patent is extended or adjusted under 35 U.S.C. 154(b) by 0 days.

(21) Appl. No.: 17/052,054

(22) PCT Filed: Apr. 30, 2019

(86) PCT No.: PCT/US2019/030008
§ 371 (c)(1),
(2) Date: Oct. 30, 2020

(87) PCT Pub. No.: WO2019/213140
PCT Pub. Date: Nov. 7, 2019

(65) Prior Publication Data
US 2021/0232018 A1    Jul. 29, 2021

Related U.S. Application Data

(60) Provisional application No. 62/664,896, filed on Apr. 30, 2018.

(51) Int. Cl.
*G02B 6/293* (2006.01)
*G02F 1/313* (2006.01)
(Continued)

(52) U.S. Cl.
CPC ....... *G02F 1/3132* (2013.01); *G02B 6/29338* (2013.01); *G02B 6/29343* (2013.01);
(Continued)

(58) Field of Classification Search
CPC ............................ G02B 6/12002; G02B 6/125; G02B 6/29338; G02B 6/29343;
(Continued)

(56) References Cited

U.S. PATENT DOCUMENTS 4,904,038 A    2/1990  Chang
5,542,009 A    7/1996  Kuehnle
(Continued)

FOREIGN PATENT DOCUMENTS

WO    WO-2019/213140 A1    11/2019

OTHER PUBLICATIONS

Ehrlichman et al., "Dual-cavity optically and electrically resonant modulators for efficient narrowband RF/microwave photonics," CLEO 1-2 (2017).
(Continued)

*Primary Examiner* — Ryan A Lepisto
(74) *Attorney, Agent, or Firm* — Alexander Akhiezer; Erik A. Huestis; Foley Hoag LLP

(57) ABSTRACT

Electro-optic devices for classical and quantum microwave photonics are provided. In various embodiments, a device comprises: a waveguide; a first ring resonator; a second ring resonator, the second ring resonator evanescently coupled to the first ring resonator and to the waveguide; a first pair of electrodes, one of the first pair of electrodes disposed within the first ring resonator and the other of the first pair of electrodes disposed without the first ring resonator; a second pair of electrodes, one of the second pair of electrodes disposed within the second ring resonator and the other of the second pair of electrodes disposed without the second ring resonator; a microwave source electrically coupled to the first and second pairs of electrodes; a bias port electrically coupled to the first and second pairs of electrodes and configured to sweep a frequency band.

57 Claims, 34 Drawing Sheets

(51) Int. Cl.
*G11C 11/42* (2006.01)
*G02B 6/12* (2006.01)
*G02B 6/125* (2006.01)

(52) U.S. Cl.
CPC .......... *G11C 11/42* (2013.01); *G02B 6/12002* (2013.01); *G02B 6/125* (2013.01); *G02B 2006/1204* (2013.01); *G02B 2006/12097* (2013.01); *G02F 2203/15* (2013.01)

(58) Field of Classification Search
CPC .. G02B 2006/1204; G02B 2006/12097; G02F 1/3132; G02F 2203/15; G11C 11/42
See application file for complete search history.

(56) References Cited

U.S. PATENT DOCUMENTS

| | | | | |
|---|---|---|---|---|
| 5,787,211 | A * | 7/1998 | Gopalakrishnan | G02F 1/0356 385/2 |
| 6,766,083 | B2 * | 7/2004 | Bona | G02B 6/12007 385/32 |
| 6,871,025 | B2 * | 3/2005 | Maleki | G02F 1/17 398/183 |
| 6,987,914 | B2 * | 1/2006 | Savchenkov | G02B 6/262 372/108 |
| 7,050,212 | B2 * | 5/2006 | Matsko | H01S 3/0627 359/239 |
| 7,092,591 | B2 * | 8/2006 | Savchenkov | G02B 6/29341 385/15 |
| 8,538,270 | B2 | 9/2013 | Seidel et al. | |
| 8,582,937 | B2 * | 11/2013 | Xu | G02F 1/025 385/50 |
| 8,625,936 | B1 | 1/2014 | Dong | |
| 8,705,899 | B2 * | 4/2014 | Meister | G02B 6/12004 385/1 |
| 9,036,951 | B2 * | 5/2015 | Bhave | G02B 26/02 385/1 |
| 9,362,963 | B2 * | 6/2016 | Nagai | H03K 17/691 |
| 9,389,413 | B2 * | 7/2016 | Lipson | G02B 6/26 |
| 9,645,469 | B2 * | 5/2017 | Lemaitre | G02F 1/2257 |
| 9,787,405 | B2 * | 10/2017 | Baehr-Jones | G02F 1/3132 |
| 9,946,027 | B2 * | 4/2018 | Knights | G02B 6/12007 |
| 10,345,674 | B2 * | 7/2019 | Middlebrook | H04B 10/505 |
| 11,092,873 | B1 | 8/2021 | Loncar et al. | |
| 2017/0139236 | A1 * | 5/2017 | Cao | G02F 1/0121 |
| 2017/0248832 | A1 * | 8/2017 | Kippenberg | G02F 1/3534 |
| 2018/0031946 | A1 | 2/2018 | Middlebrook et al. | |

OTHER PUBLICATIONS

International Search Report and Written Opinion for International Application No. PCT/US2019/030008 dated Sep. 2, 2019.
Soltani et al., "Efficient quantum microwave-to-optical conversion using electro-optic nanophotonic coupled-resonators," ARVIX.org 1-10 (2017).
Wade et al., "Wavelength conversion in modulated coupled-resonator systems and their design via an equivalent linear filter representation," Optics Letters, 40(1):107-110 (2015).
Yu et al., "Silicon dual-ring modulator driven by differential signal," Optics Letts 39(22):6379-6382 (2014).

* cited by examiner

INTEGRATED ELECTRO-OPTIC DEVICES FOR CLASSICAL AND QUANTUM MICROWAVE PHOTONICS

CROSS-REFERENCE TO RELATED APPLICATIONS

This application is the U.S. National Stage of International Application PCT/US19/30008, filed Apr. 30, 2019, which claims the benefit of U.S. Provisional Application No. 62/664,896, filed on Apr. 30, 2018, each of which is hereby incorporated by reference in its entirety.

BACKGROUND

Embodiments of the present disclosure relate to electro-optic devices, and more specifically, to integrated electro-optic devices for classical and quantum microwave photonics.

BRIEF SUMMARY

According to embodiments of the present disclosure, electro-optic devices for classical and quantum microwave photonics are provided.

In various embodiments, a device comprises: a waveguide; a first ring resonator; a second ring resonator, the second ring resonator evanescently coupled to the first ring resonator and to the waveguide; a first pair of electrodes, one of the first pair of electrodes disposed within the first ring resonator and the other of the first pair of electrodes disposed without the first ring resonator; a second pair of electrodes, one of the second pair of electrodes disposed within the second ring resonator and the other of the second pair of electrodes disposed without the second ring resonator; a microwave source electrically coupled to the first and second pairs of electrodes; a bias port electrically coupled to the first and second pairs of electrodes and configured to sweep a frequency band.

In some embodiments, the first ring resonator and/or the second ring resonator comprise lithium niobate. In some embodiments, the first ring resonator and/or the second ring resonator comprise lithium tantalate. In some embodiments, the first ring resonator and/or the second ring resonator comprise an electro-optic material. In some embodiments, the first ring resonator and/or the second ring resonator have radii of about 80 µm. In some embodiments, the first ring resonator and/or the second ring resonator have radii of 10 µm to 3000 µm. In some embodiments, the first ring resonator has a radius different from a radius of the second ring resonator.

In some embodiments, the electrodes have electrical bandwidth of at least 2 GHz. In some embodiments, the device has a modulation efficiency of at least 0.1 GHz/V.

In some embodiments, the first ring resonator and/or the second ring resonator have a photon-life time of at least 2 ns. In some embodiments, the first and second ring resonators are optically coupled with an optical coupling strength of at least 0.5 GHz. In some embodiments, the first and second ring resonators are separated by a gap having a width of about 500 nm. In some embodiments, the first ring resonator and/or the second ring resonator have a Q factor of at least $1\times10^4$. In some embodiments, the first ring resonator and/or the second ring resonator have a Q factor of at least $1\times10^5$. In some embodiments, the first ring resonator and/or the second ring resonator have a Q factor of at least $1.9\times10^6$.

In some embodiments, the first pair of electrodes and or the second pair of electrodes comprise gold. In some embodiments, the first pair of electrodes and or the second pair of electrodes comprise copper. In some embodiments, each of the first pair of electrodes is about 2.5 µm away from the first ring resonator. In some embodiments, each of the first pair of electrodes is from 1 µm to 10 µm away from the first ring resonator. In some embodiments, each of the second pair of electrodes is about 2.5 µm away from the second ring resonator. In some embodiments, each of the second pair of electrodes is from 1 µm to 10 µm away from the second ring resonator. In some embodiments, the bias port is adapted to apply a voltage in the range of ±15V.

In some embodiments, the first ring resonator and/or the second ring resonator have a cross-sectional width of about 1.4 µm. In some embodiments, the waveguide has a cross-sectional width of about 800 nm. In some embodiments, the waveguide has a cross-sectional height of about 600 nm.

In some embodiments, the first ring resonator comprises a ridge portion extending from a slab portion, the ridge portion having a height perpendicular to the slab portion and a width parallel to the slab portion. In some embodiments, the slab portion has a thickness of about 250 nm. In some embodiments, the height of the ridge portion is about 350 nm. In some embodiments, the width of the ridge portion is 1300 nm to 1500 nm. In some embodiments, the ridge portion has a cross-sectional area of at most 5 µm². In some embodiments, the ridge portion has a cross-sectional are of at most 2 µm².

In some embodiments, the second ring resonator comprises a ridge portion extending from a slab portion, the ridge portion having a height perpendicular to the slab portion and a width parallel to the slab portion. In some embodiments, the slab portion has a thickness of about 250 nm. In some embodiments, the height of the ridge portion is about 350 nm. In some embodiments, the width of the ridge portion is 1300 nm to 1500 nm. In some embodiments, the ridge portion has a cross-sectional are of at most 5 µm². In some embodiments, the ridge portion has a cross-sectional are of at most 2 µm².

In some embodiments, an inductor is electrically coupled to the first and second pairs of electrodes. In some embodiments, the inductor comprises a superconductor.

In some embodiments, the microwave source is configured to drive the first and second pairs of electrodes in a pulsed regime. In some embodiments, a pulse duration of the microwave source is less than twice a photon lifetime of the first or second ring resonator.

In various embodiments a device comprises: a waveguide; a first resonator; a second resonator, the second resonator optically coupled to the first resonator and to the waveguide; a first pair of electrodes, the first pair of electrodes disposed along one of the first or second resonator with at least a portion of said one of the first or second resonator disposed between the first pair of electrodes; a microwave source electrically coupled to the first pair of electrodes.

In some embodiments, a bias port is electrically coupled to the first pair of electrodes and configured to sweep a frequency band.

In some embodiments, a second pair of electrodes is disposed along another of the first or second resonator with at least a portion of said another of the first or second resonator disposed between the second pair of electrodes, wherein the microwave source is electrically coupled to the second pair of electrodes.

In some embodiments, a second pair of electrodes is disposed along another of the first or second resonator with at least a portion of said another of the first or second resonator disposed between the second pair of electrodes, wherein the microwave source is electrically coupled to the second pair of electrodes, the bias port is electrically coupled to the second pair of electrodes.

In some embodiments, the first resonator and/or the second resonator comprises a ring resonator. In some embodiments, the first ring resonator and/or the second ring resonator have radii of about 80 μm. In some embodiments, the first ring resonator and/or the second ring resonator have radii of 10 μm to 3000 μm. In some embodiments, the first ring resonator has a radius different from a radius of the second ring resonator. In some embodiments, the first resonator and/or the second resonator comprises a racetrack resonator. In some embodiments, the first ring resonator and/or the second ring resonator comprise lithium niobate. In some embodiments, the first ring resonator and/or the second ring resonator comprise lithium tantalate. In some embodiments, the first ring resonator and/or the second ring resonator comprise an electro-optic material.

In some embodiments, the electrodes have electrical bandwidth of at least 2 GHz. In some embodiments, the device has a modulation efficiency of at least 0.1 GHz/V.

In some embodiments, the first ring resonator and/or the second ring resonator have a photon-life time of at least 2 ns. In some embodiments, the first and second ring resonators are optically coupled with an optical coupling strength of at least 0.5 GHz. In some embodiments, the first and second ring resonators are separated by a gap having a width of about 500 nm. In some embodiments, the first ring resonator and/or the second ring resonator have a Q factor of at least $1 \times 10^4$. In some embodiments, the first ring resonator and/or the second ring resonator have a Q factor of at least $1 \times 10^5$. In some embodiments, the first ring resonator and/or the second ring resonator have a Q factor of at least $1.9 \times 10^6$.

In some embodiments, the first pair of electrodes and or the second pair of electrodes comprise gold. In some embodiments, the first pair of electrodes and or the second pair of electrodes comprise copper. In some embodiments, each of the first pair of electrodes is about 2.5 μm away from the first ring resonator. In some embodiments, each of the first pair of electrodes is from 1 μm to 10 μm away from the first ring resonator. In some embodiments, each of the second pair of electrodes is about 2.5 μm away from the second ring resonator. In some embodiments, each of the second pair of electrodes is from 1 μm to 10 μm away from the second ring resonator.

In some embodiments, the bias port is adapted to apply a voltage in the range of ±15V.

In some embodiments, the first ring resonator and/or the second ring resonator have a cross-sectional width of about 1.4 μm. In some embodiments, the waveguide has a cross-sectional width of about 800 nm. In some embodiments, the waveguide has a cross-sectional height of about 600 nm.

In some embodiments, the first ring resonator comprises a ridge portion extending from a slab portion, the ridge portion having a height perpendicular to the slab portion and a width parallel to the slab portion. In some embodiments, the slab portion has a thickness of about 250 nm. In some embodiments, the height of the ridge portion is about 350 nm. In some embodiments, the width of the ridge portion is 1300 nm to 1500 nm. In some embodiments, the ridge portion has a cross-sectional are of at most 5 μm². In some embodiments, the ridge portion has a cross-sectional are of at most 2 μm².

In some embodiments, the second ring resonator comprises a ridge portion extending from a slab portion, the ridge portion having a height perpendicular to the slab portion and a width parallel to the slab portion. In some embodiments, the slab portion has a thickness of about 250 nm. In some embodiments, the height of the ridge portion is about 350 nm. In some embodiments, the width of the ridge portion is 1300 nm to 1500 nm. In some embodiments, the ridge portion has a cross-sectional are of at most 5 μm². In some embodiments, the ridge portion has a cross-sectional are of at most 2 μm².

In some embodiments, an inductor is electrically coupled to the first and second pairs of electrodes. In some embodiments, the inductor comprises a superconductor.

In some embodiments, the microwave source is configured to drive the first and second pairs of electrodes in a pulsed regime. In some embodiments, a pulse duration of the microwave source is less than twice a photon lifetime of the first or second ring resonator.

In various embodiments, a method of light storage is provided. An optical mode is received on a waveguide. The waveguide is optically coupled to a first resonator. A microwave field is applied to a first pair of electrodes, thereby coupling the first resonator to a second resonator. The first pair of electrodes is disposed along one of the first or second resonator with at least a portion of said one of the first or second resonator disposed between the first pair of electrodes.

In some embodiments, the first resonator and/or the second resonator comprises a ring resonator. In some embodiments, the first resonator and/or the second resonator have radii of about 80 μm. In some embodiments, the first resonator and/or the second resonator have radii of 10 μm to 3000 μm. In some embodiments, the first resonator has a radius different from a radius of the second resonator. In some embodiments, the first resonator and/or the second resonator comprises a racetrack resonator. In some embodiments, the first resonator and/or the second resonator comprise lithium niobate. In some embodiments, the first resonator and/or the second resonator comprise lithium tantalate. In some embodiments, the first resonator and/or the second resonator comprise an electro-optic material.

In some embodiments, the electrodes have electrical bandwidth of at least 2 GHz. In some embodiments, the first resonator and/or the second resonator have a photon-life time of at least 2 ns. In some embodiments, the first and second resonators are optically coupled with an optical coupling strength of at least 0.5 GHz. In some embodiments, the first and second resonators are separated by a gap having a width of about 500 nm.

In some embodiments, the first resonator and/or the second resonator have a Q factor of at least $1 \times 10^4$. In some embodiments, the first resonator and/or the second resonator have a Q factor of at least $1 \times 10^5$. In some embodiments, the first resonator and/or the second resonator have a Q factor of at least $1.9 \times 10^6$.

In some embodiments, the first pair of electrodes and or the second pair of electrodes comprise gold. In some embodiments, the first pair of electrodes and or the second pair of electrodes comprise copper. In some embodiments, each of the first pair of electrodes is about 2.5 μm away from the first ring resonator. In some embodiments, each of the first pair of electrodes is from 1 μm to 10 μm away from the first ring resonator. In some embodiments, each of the second pair of electrodes is about 2.5 μm away from the second ring resonator. In some embodiments, each of the second pair of electrodes is from 1 μm to 10 μm away from the second ring resonator.

In some embodiments, the bias port is adapted to apply a voltage in the range of ±15V.

In some embodiments, the first ring resonator and/or the second ring resonator have a cross-sectional width of about 1.4 μm. In some embodiments, the waveguide has a cross-sectional width of about 800 nm. In some embodiments, the waveguide has a cross-sectional height of about 600 nm.

In some embodiments, the first ring resonator comprises a ridge portion extending from a slab portion, the ridge portion having a height perpendicular to the slab portion and a width parallel to the slab portion. In some embodiments, the slab portion has a thickness of about 250 nm. In some embodiments, the height of the ridge portion is about 350 nm. In some embodiments, the width of the ridge portion is 1300 nm to 1500 nm. In some embodiments, the ridge portion has a cross-sectional are of at most 5 μm$^2$. In some embodiments, the ridge portion has a cross-sectional are of at most 2 μm$^2$.

In some embodiments, the second resonator comprises a ridge portion extending from a slab portion, the ridge portion having a height perpendicular to the slab portion and a width parallel to the slab portion. In some embodiments, the slab portion has a thickness of about 250 nm. In some embodiments, the height of the ridge portion is about 350 nm. In some embodiments, the width of the ridge portion is 1300 nm to 1500 nm. In some embodiments, the ridge portion has a cross-sectional are of at most 5 μm$^2$. In some embodiments, the ridge portion has a cross-sectional are of at most 2 μm$^2$.

In some embodiments, an inductor is electrically coupled to the first and second pairs of electrodes. In some embodiments, the inductor comprises a superconductor.

In some embodiments, the microwave source is configured to drive the first and second pairs of electrodes in a pulsed regime. In some embodiments, a pulse duration of the microwave source is less than twice a photon lifetime of the first or second ring resonator.

In various embodiments, a method of electro-optic modulation is provided. An optical mode is received on a waveguide. The waveguide is evanescently coupled to a first ring resonator. The first ring resonator is evanescently coupled to a second ring resonator. A microwave field is applied to a first and second pair of electrodes, thereby modulating the optical mode. One of the first pair of electrodes is disposed within a first ring resonator and the other of the first pair of electrodes is disposed without the first ring resonator. One of the second pair of electrodes is disposed within the second ring resonator and the other of the second pair of electrodes is disposed without the second ring resonator.

In some embodiments, the microwave field and the optical mode are operated in a continuous regime.

In some embodiments, the first resonator and/or the second resonator comprises a ring resonator. In some embodiments, the first resonator and/or the second resonator have radii of about 80 μm. In some embodiments, the first resonator and/or the second resonator have radii of 10 μm to 3000 μm. In some embodiments, the first resonator has a radius different from a radius of the second resonator. In some embodiments, the first resonator and/or the second resonator comprises a racetrack resonator.

In some embodiments, the first resonator and/or the second resonator comprise lithium niobate. In some embodiments, the first resonator and/or the second resonator comprise lithium tantalate. In some embodiments, the first resonator and/or the second resonator comprise an electro-optic material.

In some embodiments, the electrodes have electrical bandwidth of at least 2 GHz. In some embodiments, the first resonator and/or the second resonator have a photon-life time of at least 2 ns. In some embodiments, the first and second resonators are optically coupled with an optical coupling strength of at least 0.5 GHz. In some embodiments, the first and second resonators are separated by a gap having a width of about 500 nm. In some embodiments, the first resonator and/or the second resonator have a Q factor of at least $1\times10^4$. In some embodiments, the first resonator and/or the second resonator have a Q factor of at least $1\times10^5$. In some embodiments, the first resonator and/or the second resonator have a Q factor of at least $1.9\times10^6$.

In some embodiments, the first pair of electrodes and or the second pair of electrodes comprise gold. In some embodiments, the first pair of electrodes and or the second pair of electrodes comprise copper. In some embodiments, each of the first pair of electrodes is about 2.5 μm away from the first ring resonator. In some embodiments, each of the first pair of electrodes is from 1 μm to 10 μm away from the first ring resonator. In some embodiments, each of the second pair of electrodes is about 2.5 μm away from the second ring resonator. In some embodiments, each of the second pair of electrodes is from 1 μm to 10 μm away from the second ring resonator. In some embodiments, the bias port is adapted to apply a voltage in the range of ±15V.

In some embodiments, the first ring resonator and/or the second ring resonator have a cross-sectional width of about 1.4 μm. In some embodiments, the waveguide has a cross-sectional width of about 800 nm. In some embodiments, the waveguide has a cross-sectional height of about 600 nm.

In some embodiments, the first ring resonator comprises a ridge portion extending from a slab portion, the ridge portion having a height perpendicular to the slab portion and a width parallel to the slab portion. In some embodiments, the slab portion has a thickness of about 250 nm. In some embodiments, the height of the ridge portion is about 350 nm. In some embodiments, the width of the ridge portion is 1300 nm to 1500 nm. In some embodiments, the ridge portion has a cross-sectional are of at most 5 μm$^2$. In some embodiments, the ridge portion has a cross-sectional are of at most 2 μm$^2$.

In some embodiments, the second resonator comprises a ridge portion extending from a slab portion, the ridge portion having a height perpendicular to the slab portion and a width parallel to the slab portion. In some embodiments, the slab portion has a thickness of about 250 nm. In some embodiments, the height of the ridge portion is about 350 nm. In some embodiments, the width of the ridge portion is 1300 nm to 1500 nm. In some embodiments, the ridge portion has a cross-sectional are of at most 5 μm$^2$. In some embodiments, the ridge portion has a cross-sectional are of at most 2 μm$^2$. In some embodiments, an inductor is electrically coupled to the first and second pairs of electrodes. In some embodiments, the inductor comprises a superconductor.

In some embodiments, the microwave source is configured to drive the first and second pairs of electrodes in a pulsed regime. In some embodiments, a pulse duration of the microwave source is less than twice a photon lifetime of the first or second ring resonator.

DETAILED DESCRIPTION

The present disclosure relates to devices, designs, and architectures for on-chip microwave photonics in the classical and quantum domain, using electro-optical material such as lithium niobate or lithium tantalate.

In various embodiments, improved traditional microwave photonic device designs are provided. Such designs leverage nanofabrication and device miniaturization of electro-optic materials. In various embodiments, this includes integrated phase/intensity modulators, filters, switches, and delay lines.

Figure 1:
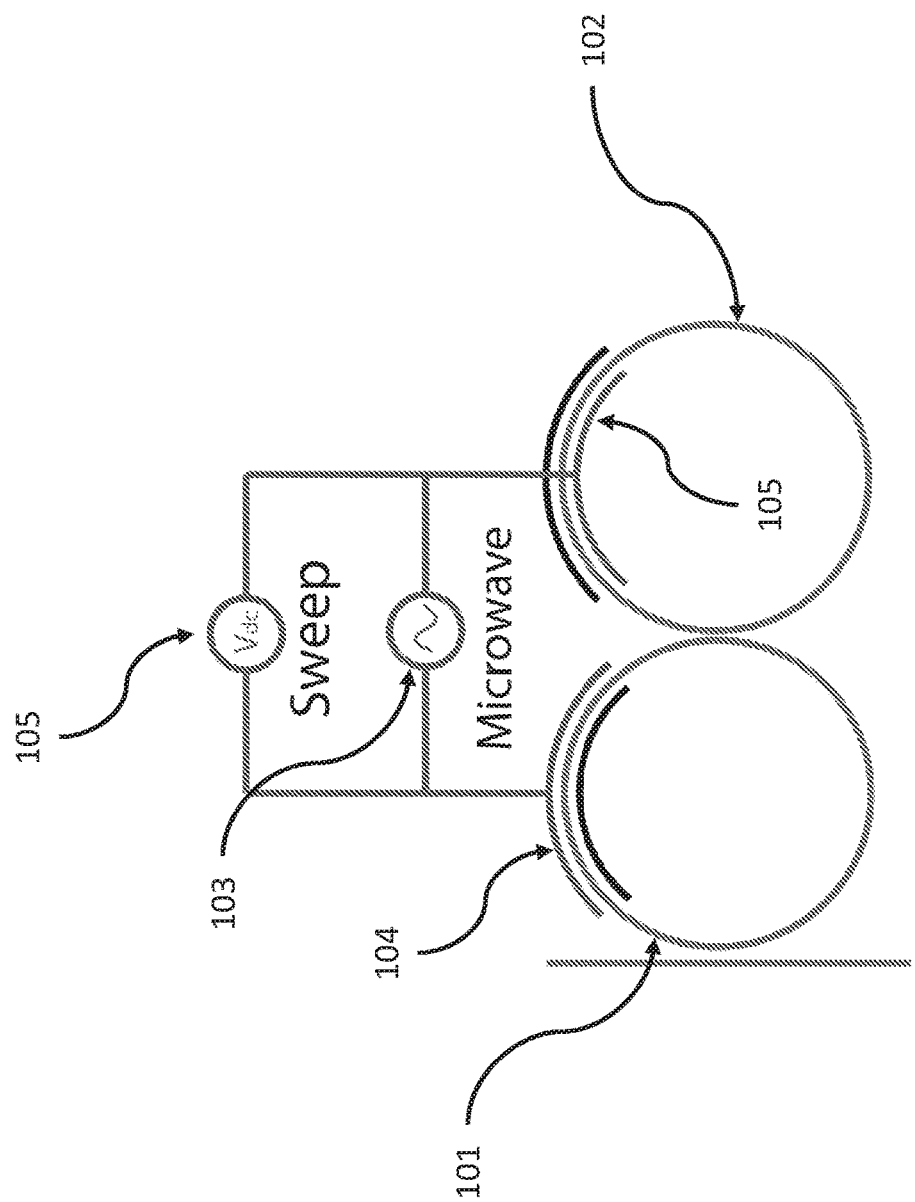
FIG. 1 is a schematic view of a double-ring microwave-to-optical converter and delay element is provided according to embodiments of the present disclosure.

Referring to FIG. 1, a schematic view of a double-ring microwave-to-optical converter and delay element is provided according to embodiments of the present disclosure. In some embodiments, the double-ring resonators 101, 102 are configured as an RF modulator. The input microwave 103 is sent to the double-ring electrodes 104, 105. A bias port 105 is added to the double-ring and actively scanned. For different bias voltages, the double-ring is sensitive to different microwave frequencies, with a bandwidth determined by the quality factor. Various embodiments include microring/micro-racetrack based devices for microwave transduction and processing. Various embodiments include devices for quantum microwave to photon conversion.

In various embodiments, an efficient classical microwave-to-optical converter is provided using coupled optical microresonators on lithium niobate with $Q=2.7 \times 10^6$. Full optical modulation depth is demonstrated with a 7 GHz microwave driving voltage $V_{rms}$ of 0.07 V.

Achieving coherent microwave-to-optical conversion is useful for many applications in quantum communications, quantum computing, and classical microwave photonics. Among many approaches such as optomechanical, piezomechanical, and using atomic spins, integrated electro-optical approaches have the advantage of low noise direct conversion, large bandwidth and high scalability. High efficiency classical coherent single-sideband microwave-to-optical conversion using a doubly-resonant coupled-microring resonator fabricated monolithically on thin-film lithium niobate. The electro-optic approach using lithium niobate achieves high efficiencies and low optical loss. The combination of low optical loss (microrings with $Q=2.7*10^6$), large electro-optical response and highly confined photonic and microwave structures allow 100% optical modulation depth with $V_{rms}=70$ mV at 7 GHz.

Figure 2A:
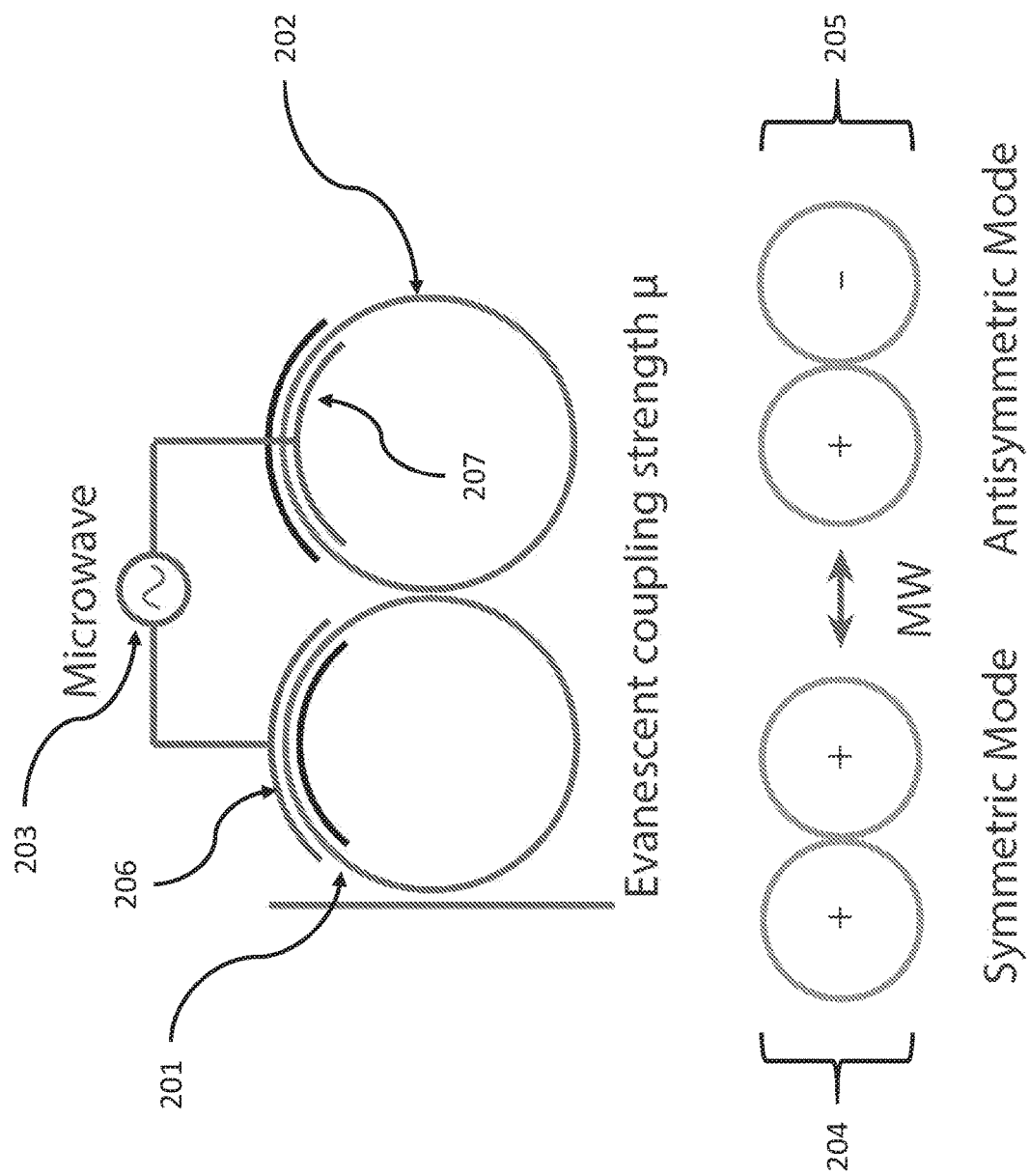
FIG. 2A is a schematic view of a double-ring microwave-to-optical converter according to embodiments of the present disclosure.

Referring to FIG. 2A, a schematic is provided of a double-ring microwave-to-optical converter according to embodiments of the present disclosure. The electro-optic converter is based on the concept of microwave assisted photonic transitions. Two micro-ring resonators 201, 202 are placed close to each other with a small gap. The two resonators are evanescently coupled through the gap with a coupling rate of μ. The optical coupling results in split normal modes of a symmetric and an antisymmetric optical mode, with an optical resonant frequency difference of μ. A coherent microwave signal 203 at frequency μ is applied to both resonators with opposite polarity to induce conversion between these two optical modes.

Figure 2B:
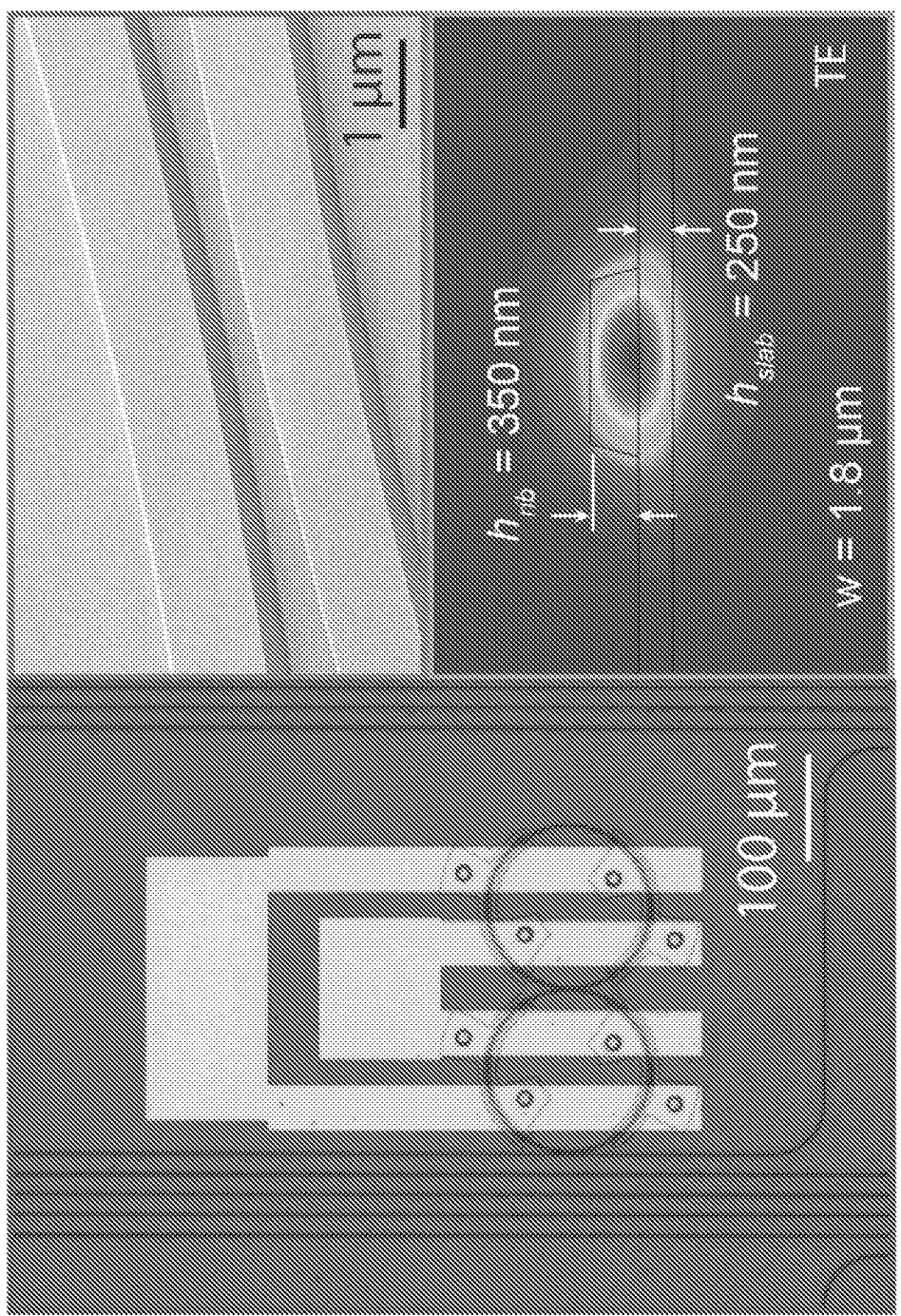
FIG. 2B is a microscope image of a fabricated double-ring resonator with microwave electrodes according to embodiments of the present disclosure.

The two new normal modes correspond to the symmetric (S) and antisymmetric (AS) modes 204, 205 of the double-ring system (FIG. 2A). Microelectrodes 206, 207 are integrated around the ring resonator to interface microwave with the photonic system. The microwave electrodes are interconnected in a way such that the phase of the modulation is opposite on the two rings—one inducing a phase advance and the other inducing a phase retardation (FIGS. 2A-B). Such design allows microwave modulation to effectively induce conversion of light between the S and AS mode.

FIG. 2B is a microscope image of a fabricated double-ring resonator with microwave electrodes according to embodiments of the present disclosure. The inset is a scanning electron microscope image of the gap between the two microrings and finite element simulation of the optical mode.

Figure 3A:
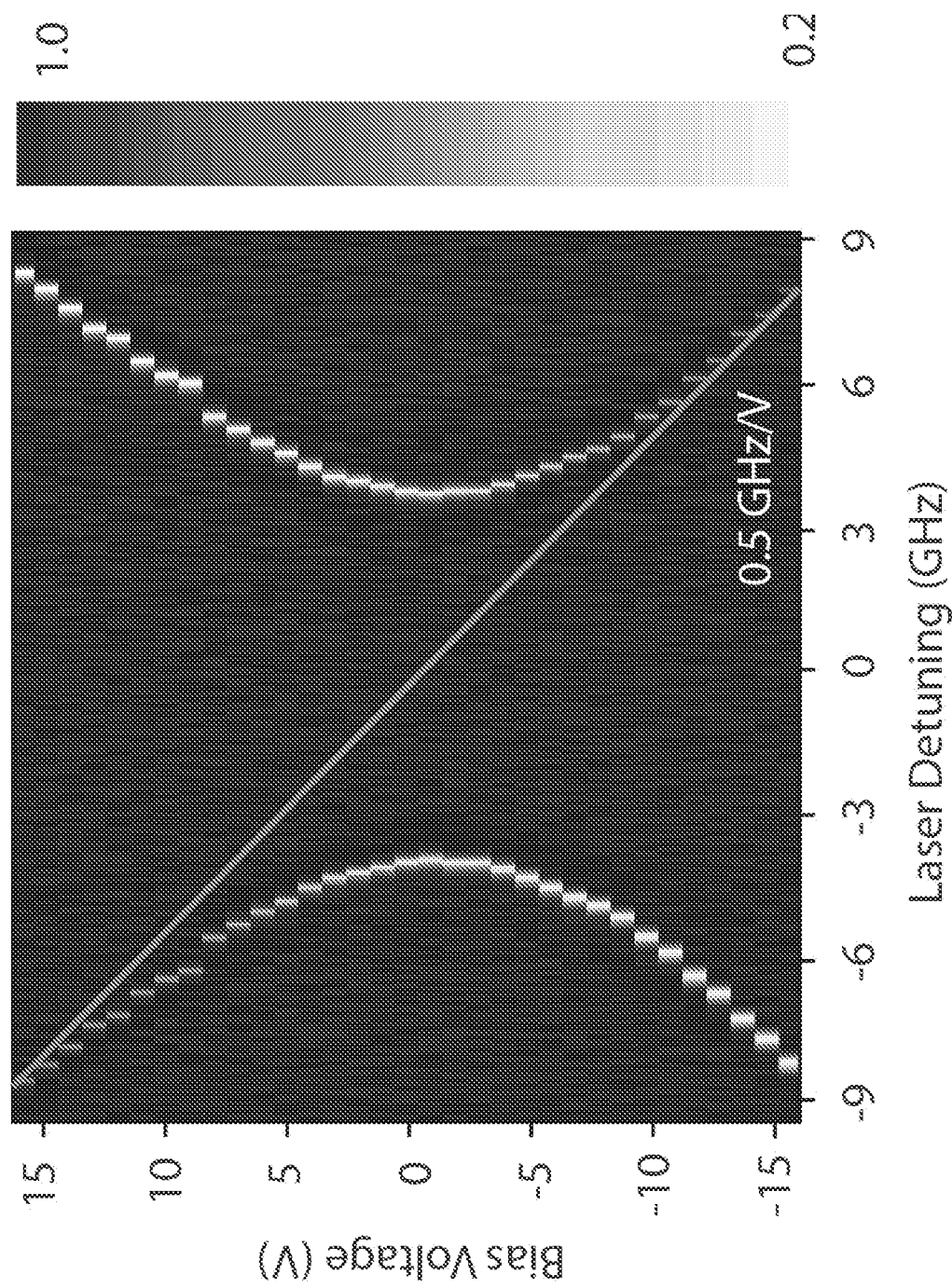
FIG. 3A is plot of bias voltage relative to laser detuning of an exemplary MZI modulator according to embodiments of the present disclosure.

FIG. 3A is an electro-optic bandwidth characterization of a 2 mm long MZI modulator.

Figure 3B:
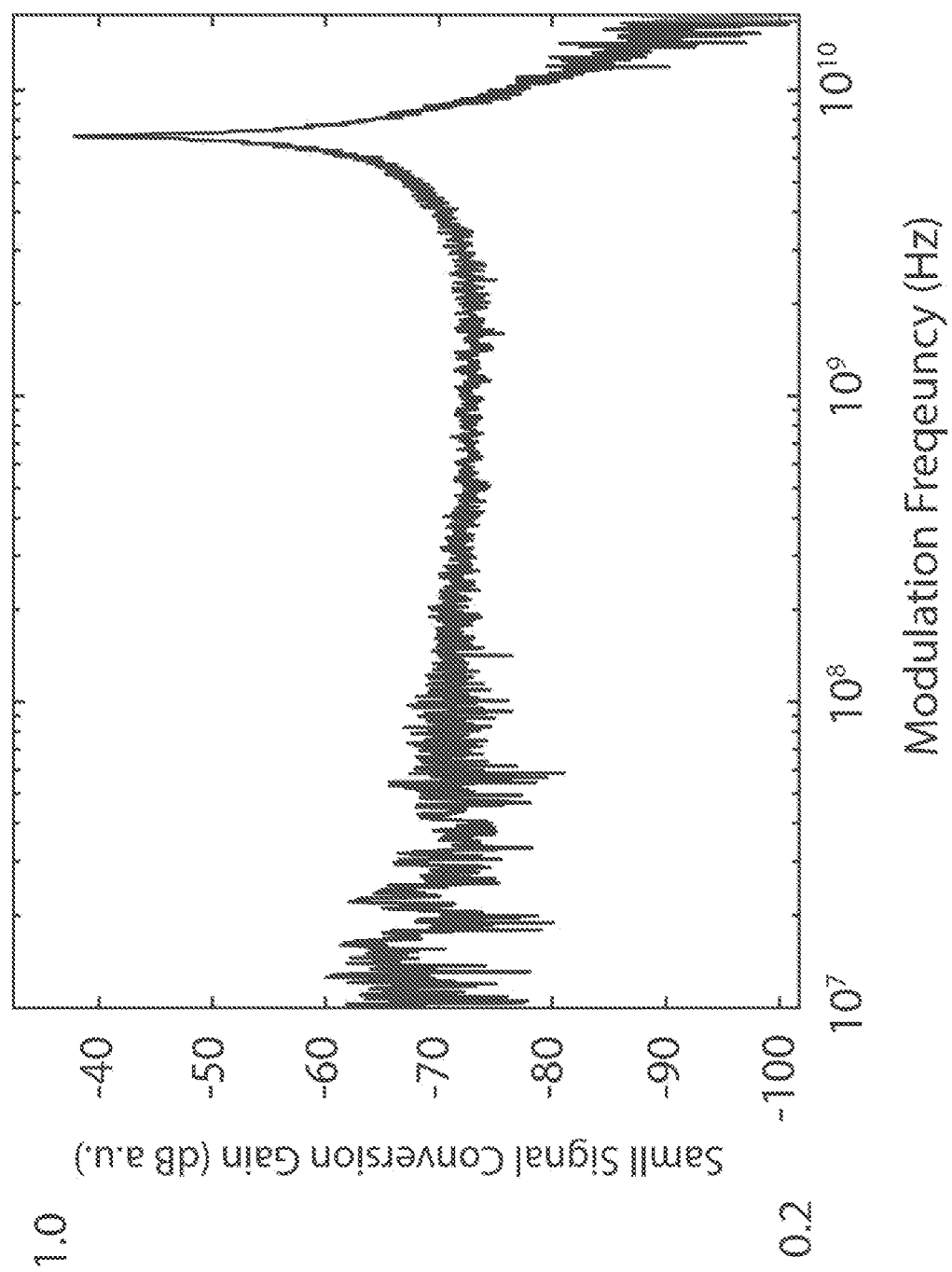
FIG. 3B is a plot of conversion gain relative to modulation frequency of an exemplary micro-racetrack modulator according to embodiments of the present disclosure.
Figure 3C:
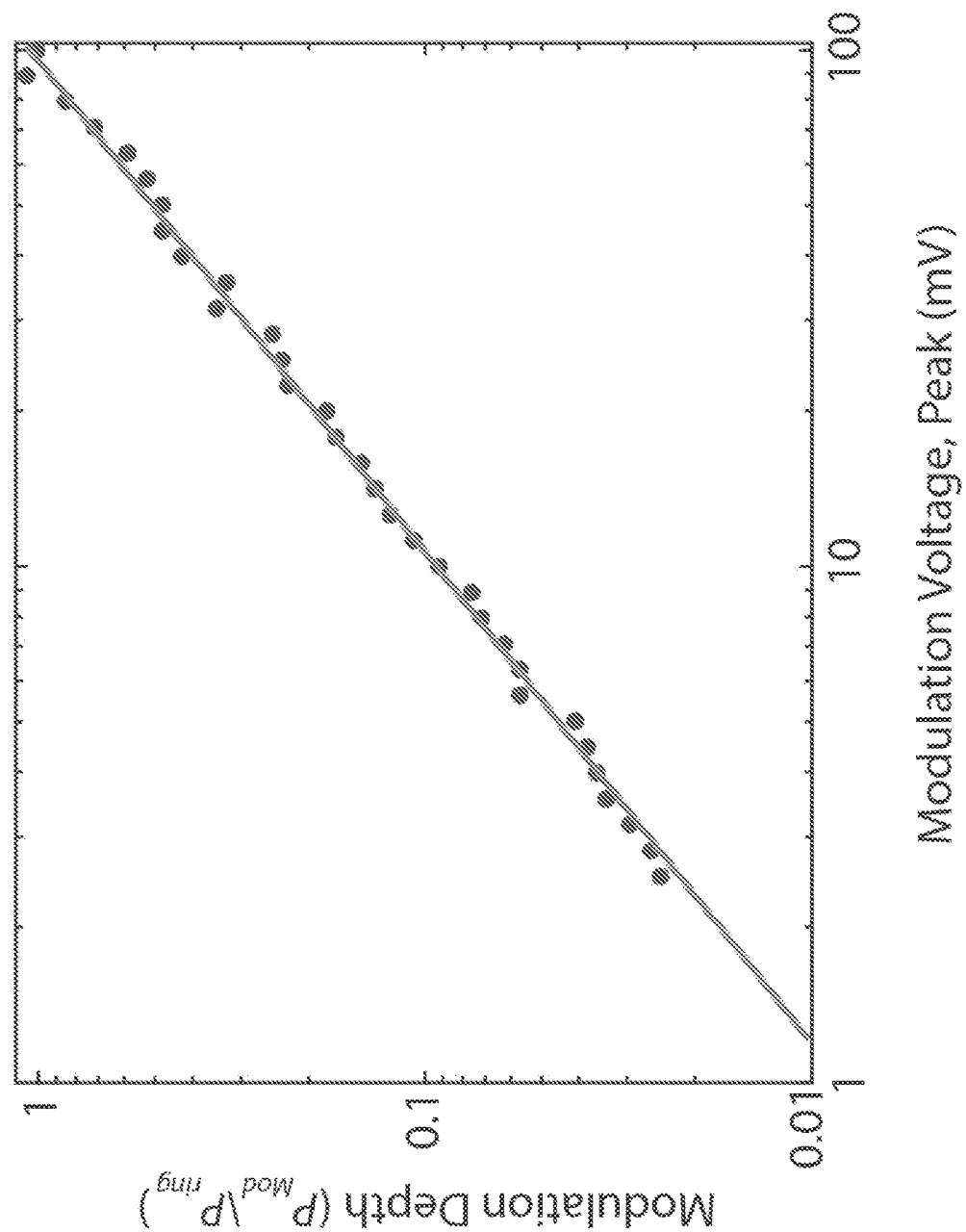
FIG. 3C is an electro-optic eye-diagrams for an exemplary MZI and racetrack modulator according to embodiments of the present disclosure.

FIG. 3B is an electro-optic bandwidth characterization of a micro-racetrack modulator with a Q=8000. The 3 dB electro-optic bandwidths of the two devices are 15 GHz and 30 GHz respectively. FIG. 3C is an electro-optic eye-diagrams for the MZI (purple) and racetrack (blue) modulator showing a bandwidth limited data rate of 22 Gb/s for the MZI and 40 Gb/s for the micro-racetrack modulator.

Figure 2C:
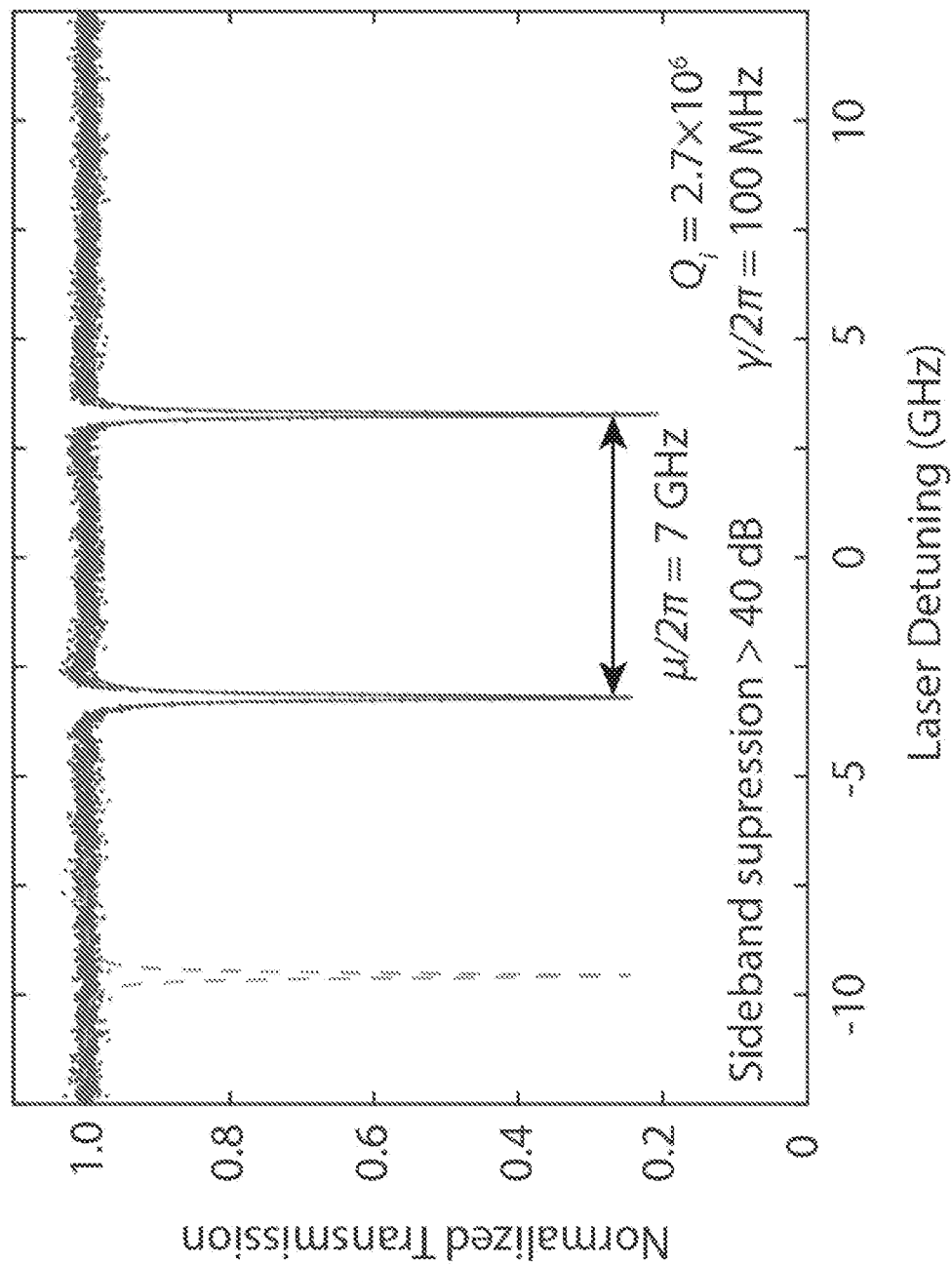
FIG. 2C is a plot of normalized transition relative to laser detuning according to embodiments of the present disclosure.

The coupled microring resonator integrated with electrodes exhibits a split resonance with a load quality factor $Q_l=1.8\times10^6$ and intrinsic quality factor of $Q_i=2.7\times10^6$. It is evident from the spectrum that the coupled mode converter allows for single-sideband conversion (FIG. 2C). As a bias voltage is applied on the electrode, a difference is created in the resonant frequencies of each ring. This results in a resonance shift and relative extinction change of the split modes—a typical anti-crossing of the two coupled optical modes is apparent (FIG. 3A). The minimum separation of the optical modes at ~0 V bias corresponds to the coupling strength of $\mu/2\pi=7$ GHz.

The microwave modulation efficiency is dramatically enhanced at the designed mode-splitting frequency of 7 GHz. A vector network analyzer (VNA) is used to apply small microwave signals at different frequency and coherently detects the modulated frequency using an amplified photodiode. When the optical resonances of the two rings are identical and the input laser is positioned on one of the resonant modes, the input voltage does not modulate the light at the inflection point on the anti-crossing curve (FIG. 3A ~0V bias) since the first order response is zero. As the microwave frequency is increased to the designed 7 GHz conversion frequency, large increase in conversion gain is observed (FIG. 3B).

At 7 GHz modulation frequency, near unit optical modulation depth is achieved with a driving voltage of $V_p=100$ mV ($V_{rms}=70$ mV). The response of the system follows a linear relationship as expected from the $\chi(2)$ system. Here the modulation depth is defined as $P_{Mod}/P_{ring}$ where $P_{Mod}$ and $P_{ring}$ are the peak-to-peak optical modulation power and power coupled into the ring respectively.

Integrating the existing structure with a superconducting microwave resonator enables coherent microwave-to-photon conversion on a scalable integrated electro-optics platform at the quantum level. As devices according to the present disclosure feature a small electrode capacitance (~10 fF) and a large electro-optic coefficient of 0.5 GHz/V, it can reach a large vacuum coupling rate $g_0>5$ kHz in a microwave resonator. In addition to quantum conversion, the tunability, large bandwidth, high efficiency and scalability could lead to a new generation of electro-optic devices for classical microwave photonics and sensing applications.

When the microwave field and optical field operate in a continuous mode, the two rings operate like a low half-wave voltage electro-optic modulator. The input microwave signal induces mode transfer between the two modes of the double-ring system, which is imprinted as a single sideband modulation on the output optical signal. This single-side band modulation carries the information of the microwave drive. This modulation, however is narrow band, as shown in the response curve in FIG. 3B, where the microwave response is enhanced at ~7 GHz. In various embodiments, the bias voltage (DC) is swept slowly relative to the microwave frequency to shift the maximum response frequency of the microwave signal, e.g., scanning from 3 GHz to 100 GHz by changing the DC voltage. This way, a broad microwave spectrum is covered although the response is narrow band at any instantaneous moment. This architecture can be used for microwave spectrum analysis for incoming microwave signals by sweeping the DC port and recording the modulation response for each DC bias voltage. In this configuration, the electrodes may be configured as an electrical antenna that receives microwave signals from the free space instead of the current electrodes that receives microwave signal by physical contact.

Figure 4:
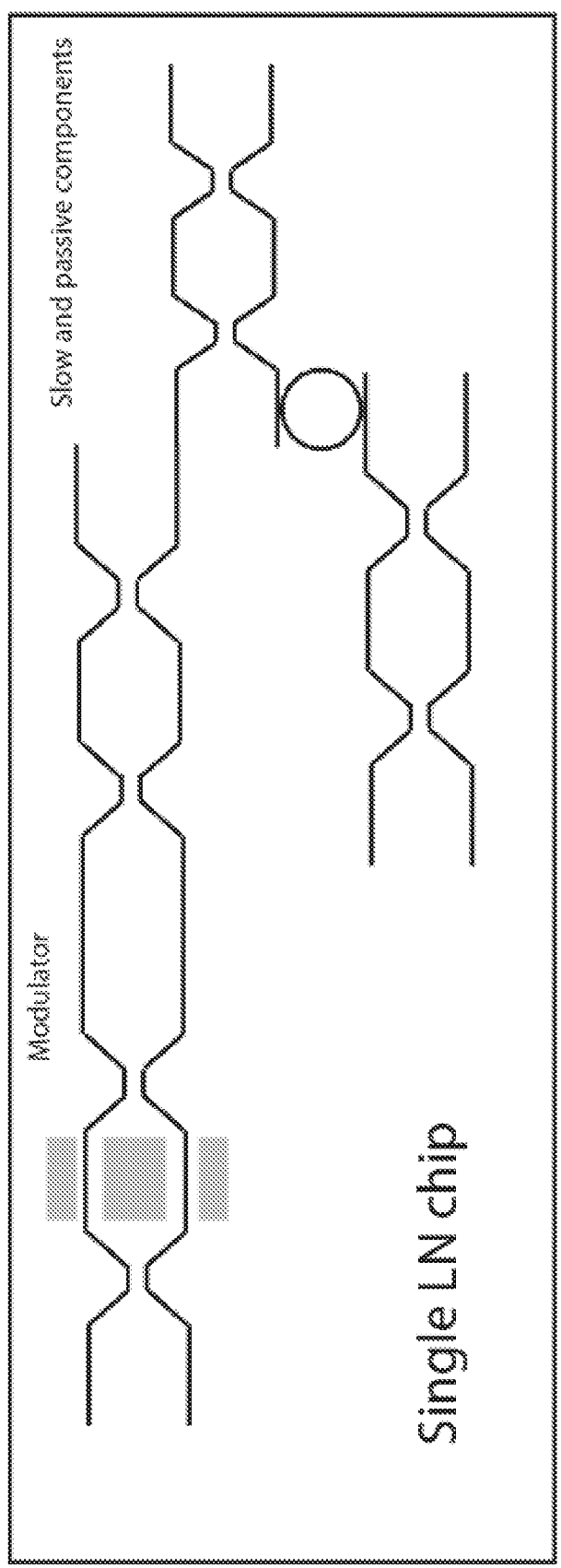
FIG. 4 is a schematic view of an exemplary architecture according to embodiments of the present disclosure.

Referring to FIG. 4, an exemplary architecture is illustrated according to embodiments of the present disclosure. In various embodiments, networks of the above devices are combined to build various microwave photonic systems. In this exemplary architecture, the modulator and slow passive photonic components are realized on the same chip using LN and other $\chi(2)$ materials. This also includes design where multiple modulators are used in addition to passive elements on the same chip.

Controlling physical systems with discrete energy levels form the basis of modern quantum and optoelectronic technology. Realizing such systems in photonics enables dynamical and coherent control over the amplitude, phase and frequency of light. In the present disclosure, a photonic molecule is provided with two distinct energy-levels and control it by external microwave excitation. In particular, the microwave addressable photonic molecule is realized using a pair of active ultra-low loss lithium niobate microring resonators. Signature two-level dynamics is shown including microwave induced photonic Autler-Townes splitting, Stark shift, Rabi oscillation and Ramsey interference. Leveraging the coherent control of optical energy, on-demand photon storage and retrieval in optical microresonators is shown by reconfiguring the photonic molecule into a bright-dark mode pair. These results of dynamic control of light in a programmable and scalable electro-optic platform is useful for applications in microwave photonic signal processing, quantum photonics in the frequency domain, optical computing concepts, and simulations of complex physical systems.

Physical systems with discrete energy levels are ubiquitous in nature and are fundamental building blocks of quantum technology. An example is a bound electron inside an atom or a molecule, where the state of the electron can be controlled and functionalized by external electromagnetic fields. Realizing controllable artificial atom—and molecule-like systems for light allows for coherent and dynamic control of the frequency, amplitude and phase of photons, enabling the investigation of complex physical phenomena and unique functionalities, including on-demand photon storage and retrieval, coherent optical frequency shift and optical quantum information processing at room temperature.

A coherent photonic two-level system that can be programmed and dynamically controlled, is a useful building block of such systems. In the present disclosure, an electronically programmable photonic molecule is provided with distinct energy levels, using a pair of evanescently bounded ultralow loss lithium niobate optical microring resonators. Full-coherent control of the photonic molecule is provided through gigahertz microwave induced photonic Autler-Townes splitting, Stark shift, Rabi oscillations and Ramsey interference. Leveraging such level of control, on-demand photon storage and retrieval is provided. This is achieved by reprogramming the photonic molecule to support a pair of bright-and-dark optical modes, where photons are stored in the long lifetime dark mode and released via bright mode using pulsed microwave signals. These results of electrically controlled photonic molecule enable light control concepts realizable in a compact, scalable and programmable photonic platform, enabling applications in microwave signal processing, quantum photonics in the frequency domain and exploring concepts in optical computing and topological physics.

Photonic analogues of condensed matter systems are useful resulted in photonic crystals, parity-time symmetric systems, and topological photonic systems, quantum ground state cooling of nanomechanical systems, sensors, and one-way lasers. A photonic analogue of a two-level system allows control over the energy and phase of photons using the concept of two-level systems control in atomic or nuclear systems. Furthermore, photonic structures have the freedom to be designed and tailored for specific applications without being limited to naturally forming systems. While realizing a photonic system with discrete energy levels is straightforward, for example using modes of an optical resonator, controlling such a system dynamically is challenging as it requires mixing of optical frequencies via strong nonlinear processes.

Electro-optic methods are suited for controlling photonic two-level systems since electrical signals are readily programmable and allow for large scale integration. In coherent electro-optic control, the photon lifetime of each energy state should be longer than the time required to drive the system from one state to the other. Such a system can be implemented using modes of ultra-high quality (Q) factor optical cavity fabricated in a material platform that allows for fast and efficient electro-optic modulation.

FIG. 5 illustrates an exemplary microwave-controlled photonic molecule according to embodiments of the present disclosure. FIG. 5A illustrates the photonic two-level system realized by a pair of identical coupled optical microring resonators 501, 502 ($\omega 1=\omega 2$). The coupling forms a photonic molecule with two distinct energy levels, a symmetric 503 (S) and an antisymmetric 504 (AS) mode that are spatially $\pi$ out of phase. Microwave field can interact coherently with the photonic two-level system through the strong Pockels effect enabled by second order nonlinear ($\chi(2)$) of lithium niobate. FIG. 5B is a false-coloured scanning electron microscope (SEM) image of the coupled microring resonators 511, 512 fabricated on thin-film lithium niobate. To maximize the effective microwave-photonic interaction strength, gold microwave electrodes 513 are patterned to achieve differential driving that induces a phase delay on one ring (512) and phase advance on the other one (511). FIG. 5C is a plot of measured transmission spectrum of the photonic two-level system. The two optical modes are separated by $2\mu=2\pi\times 7$ GHz with linewidths of $\gamma=2\pi\times 96$ MHz, which corresponds to a loaded (intrinsic) optical quality factor of $1.9\times 106$ ($2.3\times 106$). FIG. 5D shows DC Stark effect achieved by applying a DC electric field to the two-level system. The DC field blue-shifts one ring and red-shifts the other one. The resulting transmission spectra show an anti-crossing curve due to the optical coupling between the two rings. From the asymptote of the anti-crossing, a microwave-optical coupling efficiency of $g=2\pi\times 0.5$ GHz/V is extracted. NT stands for normalized transmission.

Figure 5A:
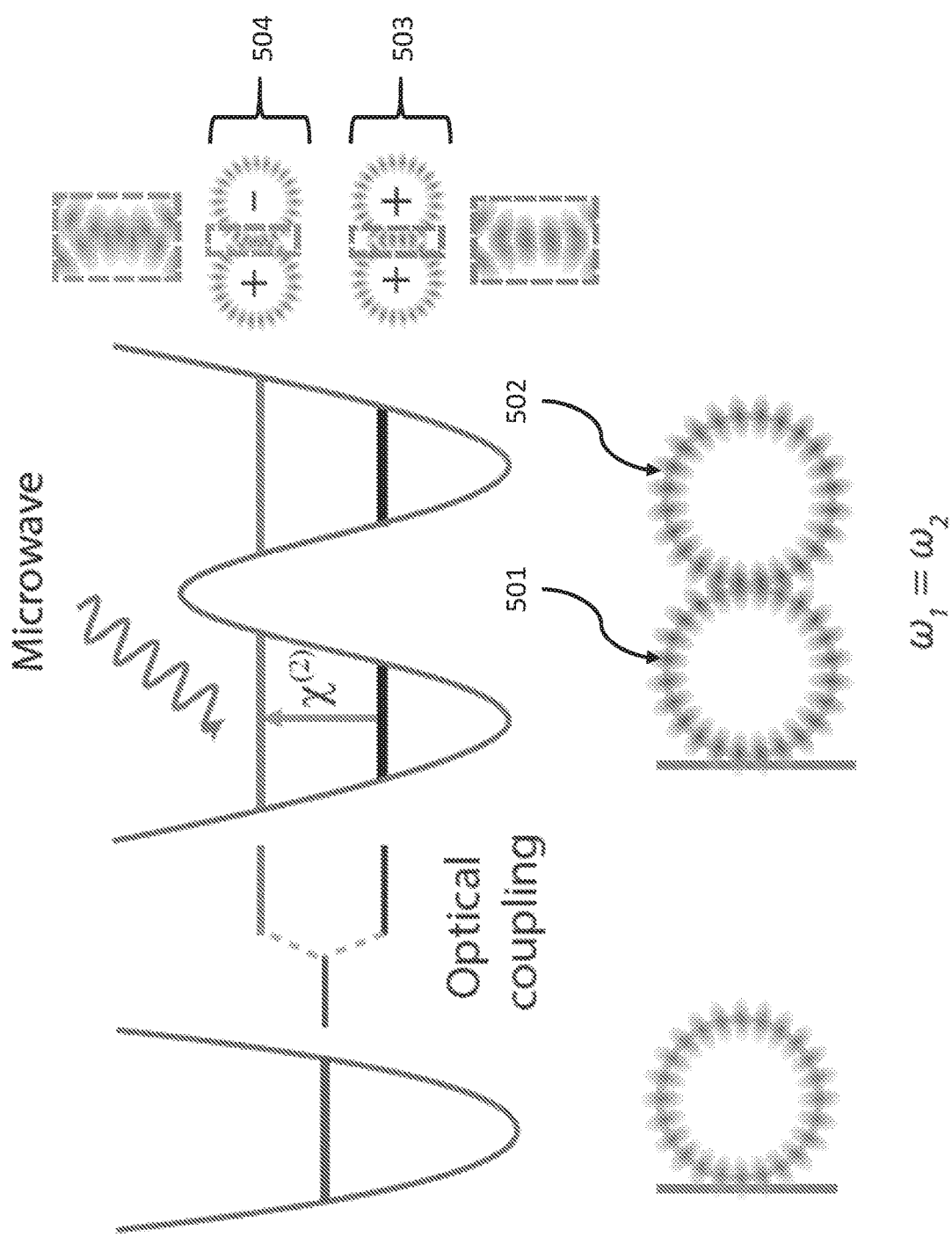
FIGS. 5A-D illustrate an exemplary microwave-controlled photonic molecule according to embodiments of the present disclosure.

The present disclosure provides a programmable photonic two-level system that can be dynamically controlled using gigahertz microwave signals (FIG. 5A). Specifically, a microwave addressable photonic molecule is provided using a pair of 80-μm radius integrated lithium niobate (LN) microring resonators patterned in close proximity to each other. The low optical loss and efficient co-integration of optical waveguides and microwave electrodes allow simultaneously achieve large electrical bandwidth (>30 GHz), strong modulation efficiency (0.5 GHz/V) and long photon-life time (~2 ns).

Figure 5B:
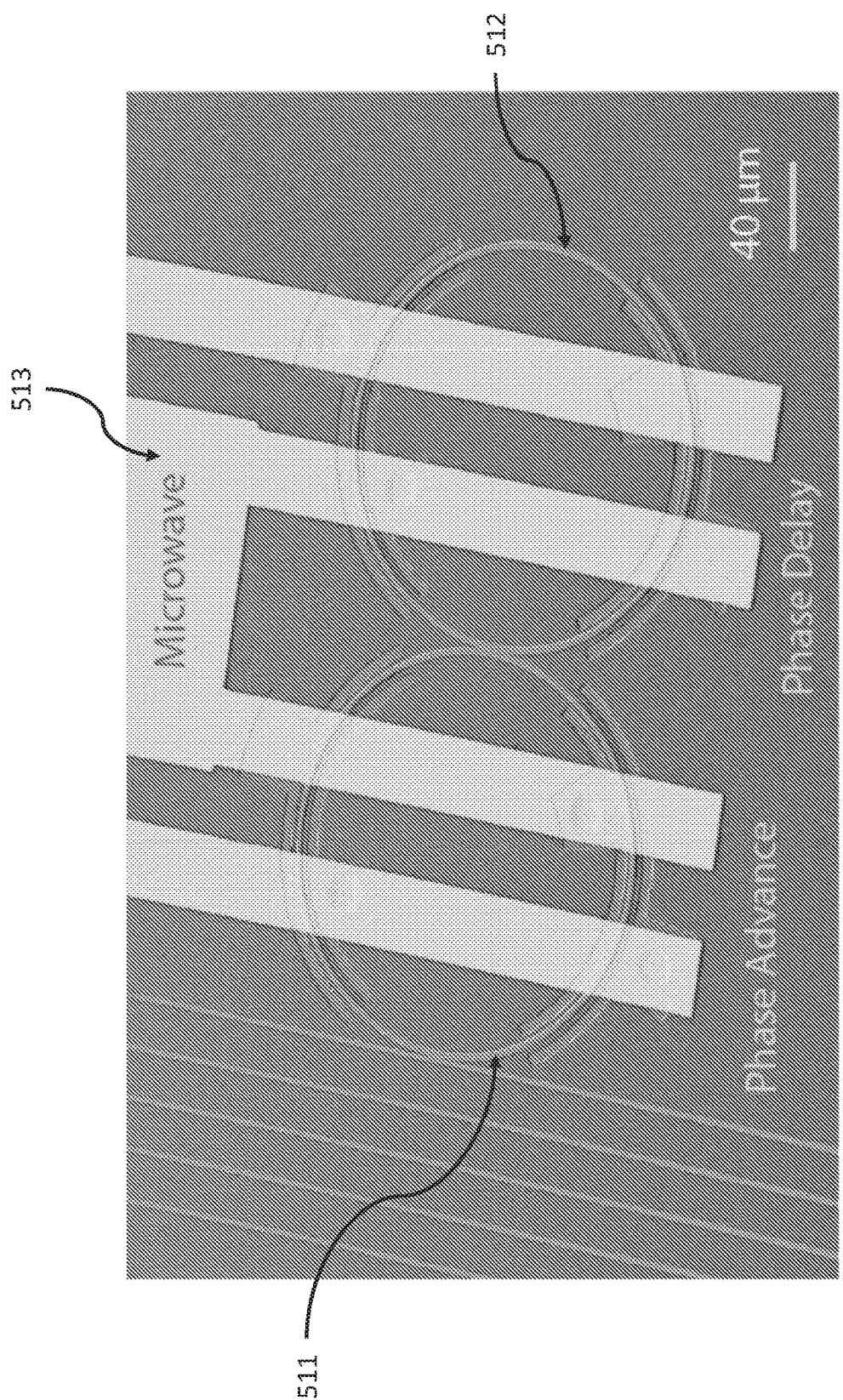
Figure 5C:
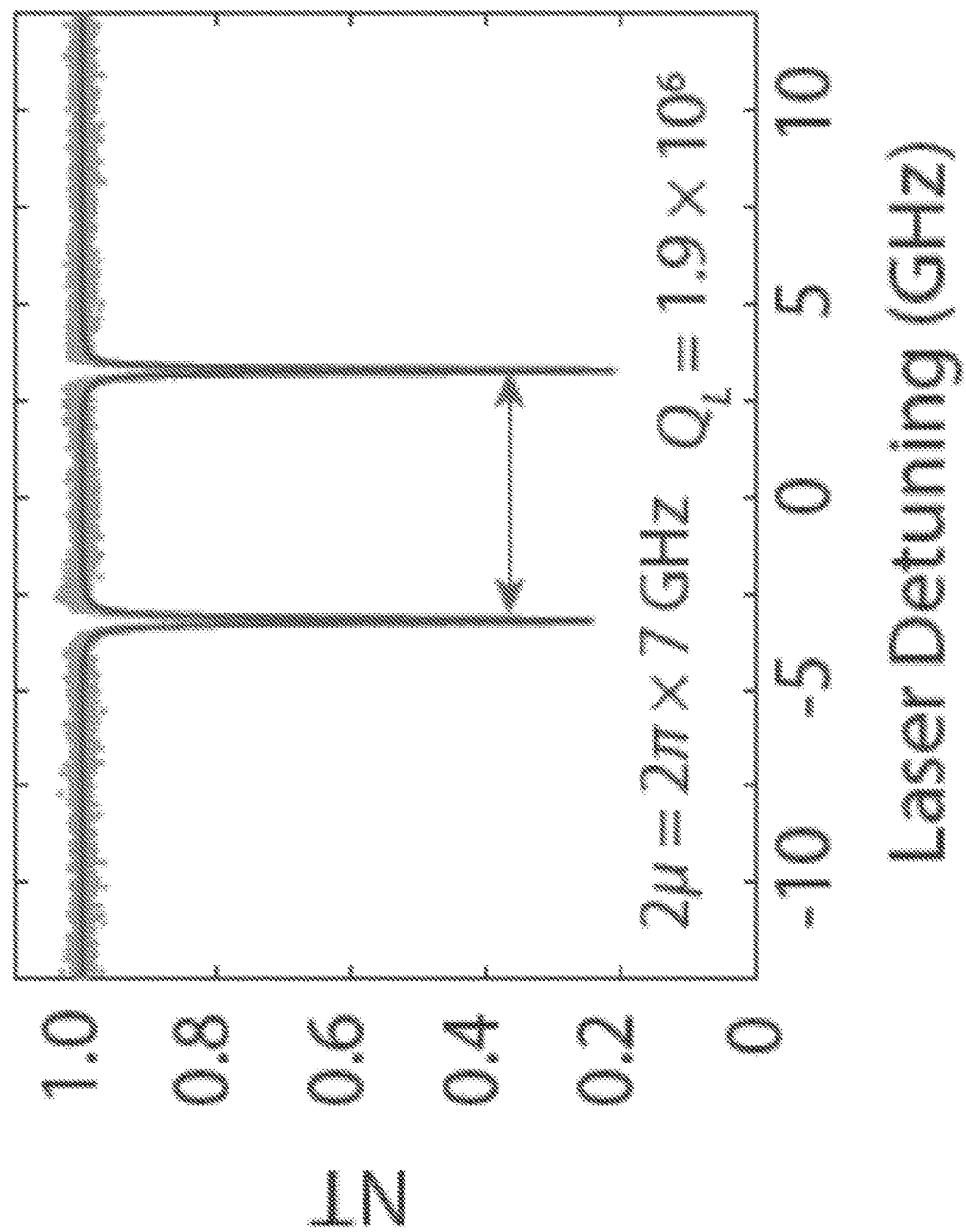
Figure 5D:
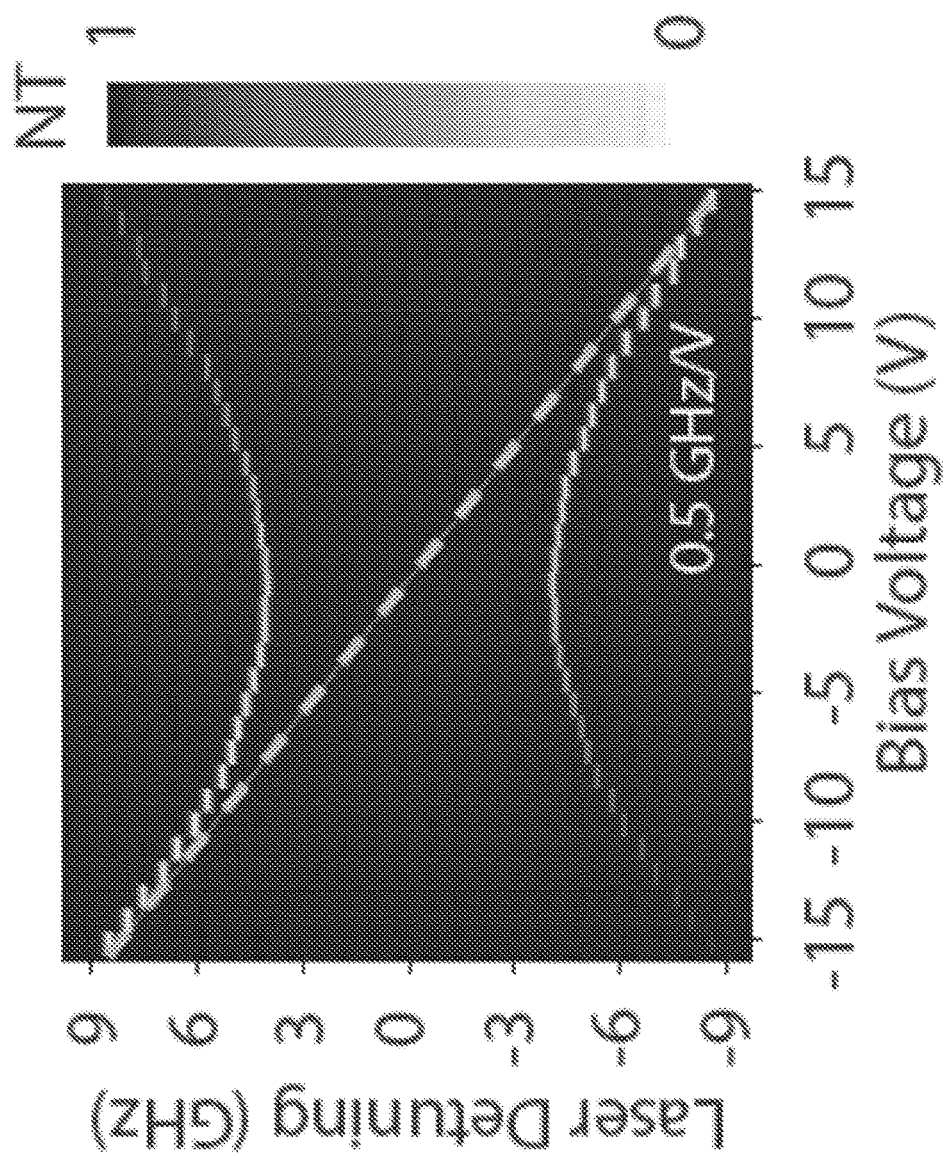

The photonic molecule supports a pair of well-defined optical energy levels, which are evident from the optical transmission measured using a tuneable telecom wavelength laser (FIG. 5C). The two optical energy levels are formed by the evanescent coupling of light from one resonator to another through a 500-nm gap. When the optical coupling strength $\mu$ exceeds the optical loss rate $\gamma$ of each cavity, the coupling leads to a normal mode splitting resulting in a frequency doublet consisting of a lower frequency symmetric (S) and a higher frequency antisymmetric (AS) optical mode (FIGS. 5A and C). The S (AS) mode spatially spans both optical cavities, with the light in the two cavities being in-(out-of-) phase. The two new eigenmodes, separated in frequency by the optical coupling strength, are the energy states of the photonic molecule. In this case, the two optical modes are separated by $2\mu=2\pi\times 7$ GHz and have cavity linewidths of $\gamma=2\pi\times 96$ MHz, corresponding to a loaded (intrinsic) quality factors of $Q=1.9\times 10^6$ ($Qi=2.5\times 10^6$), thus forming a well-resolved two-level system (FIG. 5C).

Photonic transitions are induced in the two-level system using high-frequency electro-optic phase modulation of the two modes. The phase modulation is realized through the Pockels effect ($\chi(2)$) of LN, where the optical refractive index can be changed by an applied electric field, with a response time on the femtosecond scale. To enable strong overlap between microwave and optical fields without significantly increasing the optical loss, gold microelectrodes are placed 2.5 μm away from the edge of the rings that form the photonic molecule (FIG. 5B). The microwave circuit layout is designed to induce a phase delay on one ring and a phase advance on the other ring therefore introducing coupling between the spatially orthogonal S and AS modes (FIG. 5A).

There is an analogue between an atomic two-level system and the photonic two-level system, that can be leveraged to demonstrate the control of the photonic molecule. The electro-optic effect plays the role equivalent to that of an electric dipole moment in the case of an atomic two-level systems, where in both systems external electromagnetic fields are used to couple and address the energy levels. Building on this analogy, the energy levels of the photonic molecule can be programmed by applying a direct current (DC) electric field, the effect equivalent to a DC Stark shift used to control the energy levels in an atom. This is accomplished by applying a DC bias voltage in the range of ±15 V to the microwave electrodes, which results in an avoided crossing curve shown in FIG. 5D. The extracted tuning/modulation efficiency is $g=2\pi\times 0.5$ GHz/V, and is due to the highly efficient overlap between microwave and optical fields enabled by our system.

Figure 6A:
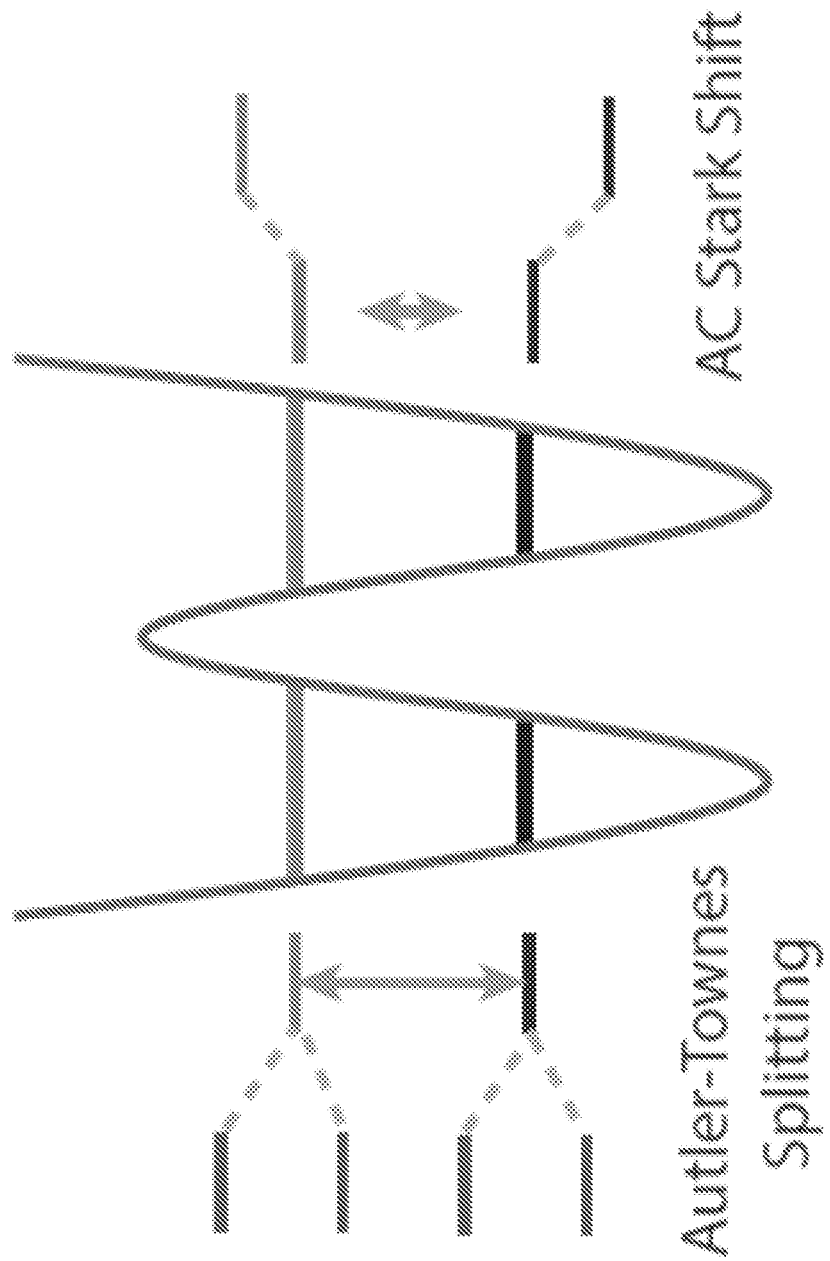
FIG. 6A-C illustrate illustrates microwave dressed photonic states according to embodiments of the present disclosure.
Figure 6B:
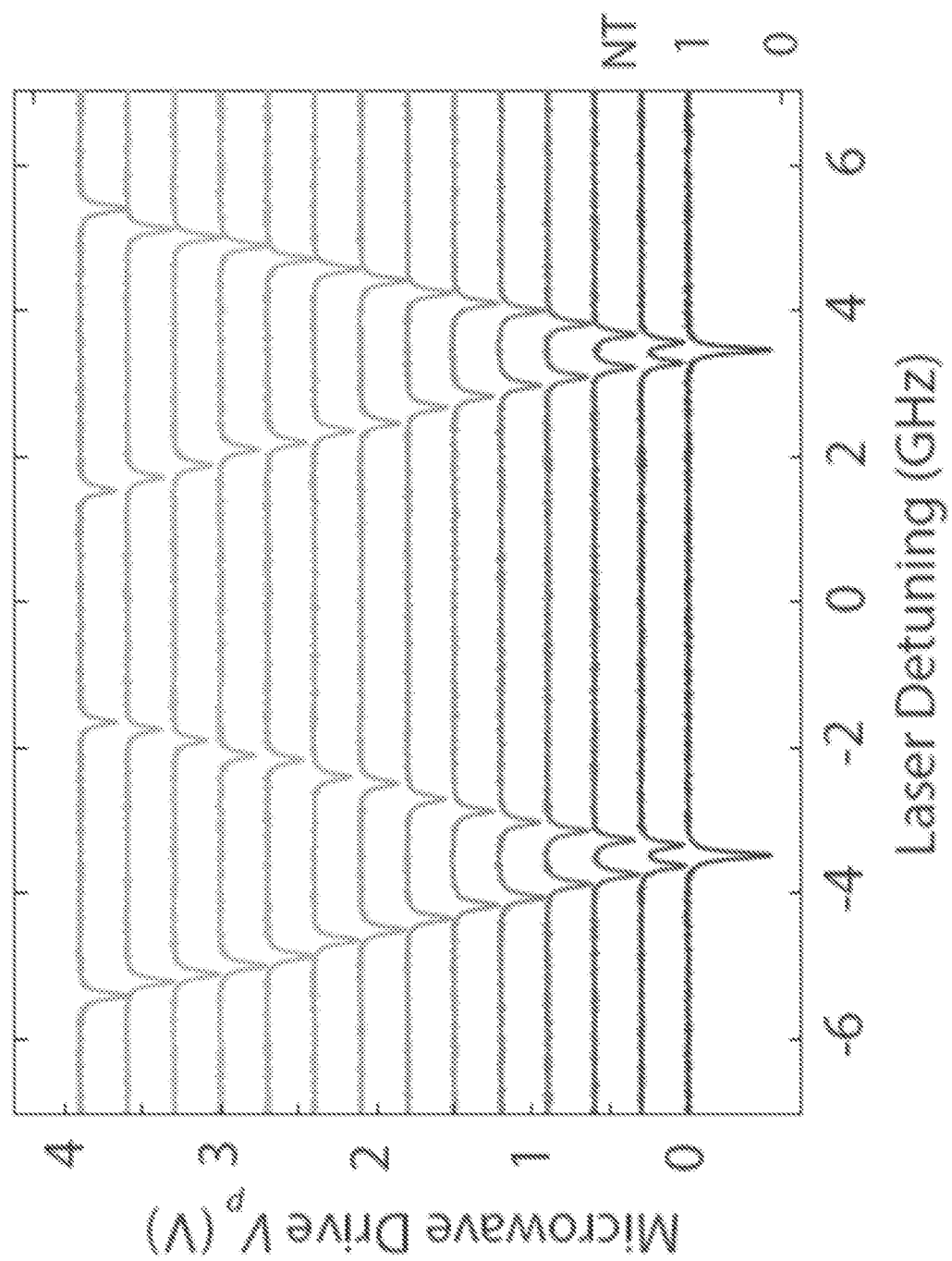
Figure 6C:
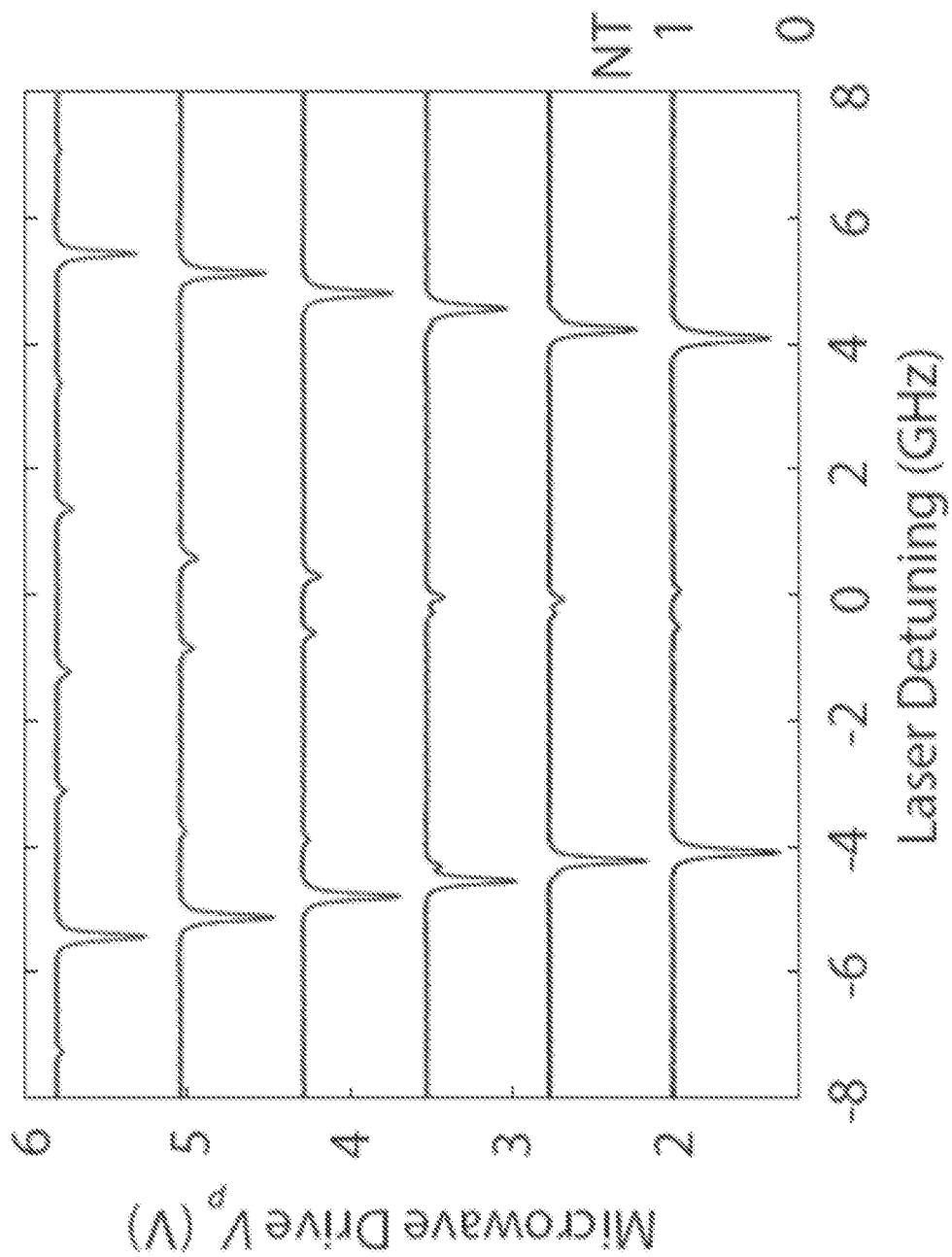

FIG. 6 illustrates microwave dressed photonic states. FIG. 6A shows that when the applied microwave frequency is tuned to the match the mode separation, dissipative coupling leads the two photonic levels to split into four levels—the effect referred to as the microwave induced photonic Autler-Townes (AT) splitting. When the microwave is detuned far from the photonic mode splitting, the photonic energy levels experience a dispersive effect, leading to photonic AC Stark shifts. FIG. 6B shows measured AT splitting in the photonic molecule where the splitting can be accurately controlled by the amplitude of the applied microwave. FIG. 6C shows measured photonic AC Stark shifts for a microwave signal at 4.5 GHz. NT: normalized transmission.

The response of the photonic molecule to a continuous wave (CW) coherent microwave field is described below. When the microwave frequency matches the energy difference of the two-levels, an effective coupling between the two initially decoupled S and AS modes is introduced, leading to microwave induced photonic Autler-Townes splitting (Rabi splitting), shown in FIGS. 6A-B. This is similar to the emergence of dressed states in the case of an atomic two-level system resonantly excited with CW light. In our system, the splitting frequency can be precisely controlled up to several gigahertz by controlling the amplitude of the microwave signals (FIG. 6B). When the microwave frequency is far detuned from the transition frequency, a dispersive effect in the level splitting is induced, analogous to the AC Stark shift observed in the atomic systems (FIGS. 6A, C). Importantly, this shift can be used to control the effective coupling strength between the energy levels of the photonic molecule, which is otherwise determined by geometric factors.

FIG. 7 shows coherent spectral dynamics in the photonic molecule. FIG. 7A, B show measured and theoretically predicted, respectively, Rabi oscillation for different microwave strengths applied to the photonic two-level system indicating the control of the Rabi frequency over a wide range. The excitation laser is tuned to the frequency of the symmetric mode (mode c1). As the microwave field is turned on at t=0, the photon oscillates between the two energy levels leading to the observed signals. The measurements are in excellent agreement with theoretical predictions. FIG. 6C shows Rabi oscillation observed for microwave Vp=1.1V at 1.1 GHz. This corresponds to rotation along the real-axis of the Bloch sphere. Inset shows the corresponding photon population (measured) in mode c1. FIG. 6D shows oscillatory signals on a photodetector showing photonic Ramsey interference observed when δ-detuned microwave π/2 pulses are applied. The first π/2 pulse prepares the light in a superposition of the two optical modes with a precession frequency determined by δ. The second π/2 pulse with a delay τ have oscillating projections on to c1 resulting in the measured Ramsey fringes. The solid curve shows calculated signal.

The optical coherence time is ~1.6 ns for both Rabi and Ramsey oscillations in agreement with the cavity decay time.

Figure 7A:
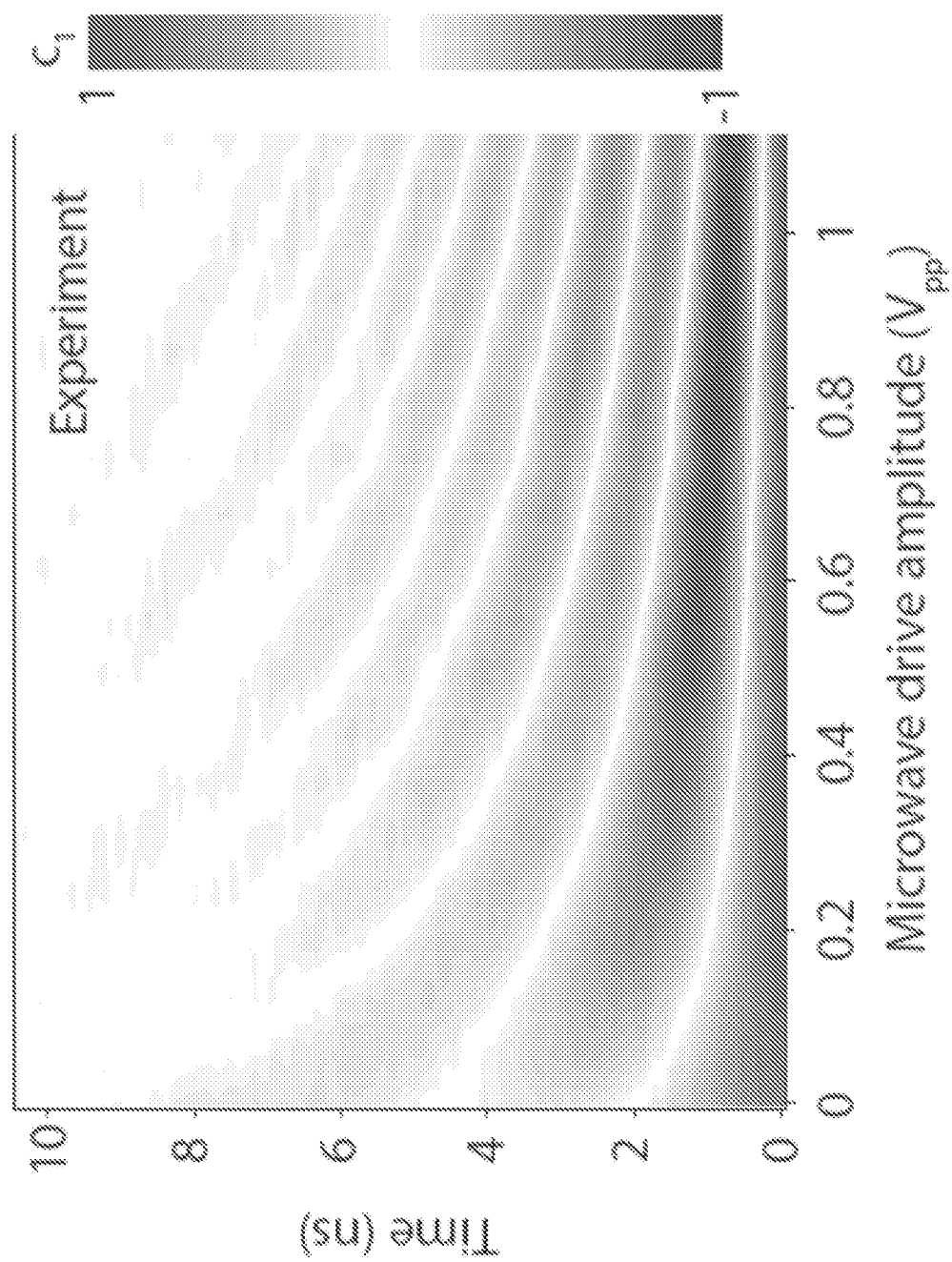
FIGS. 7A-D illustrate coherent spectral dynamics in a photonic molecule according to embodiments of the present disclosure.
Figure 7B:
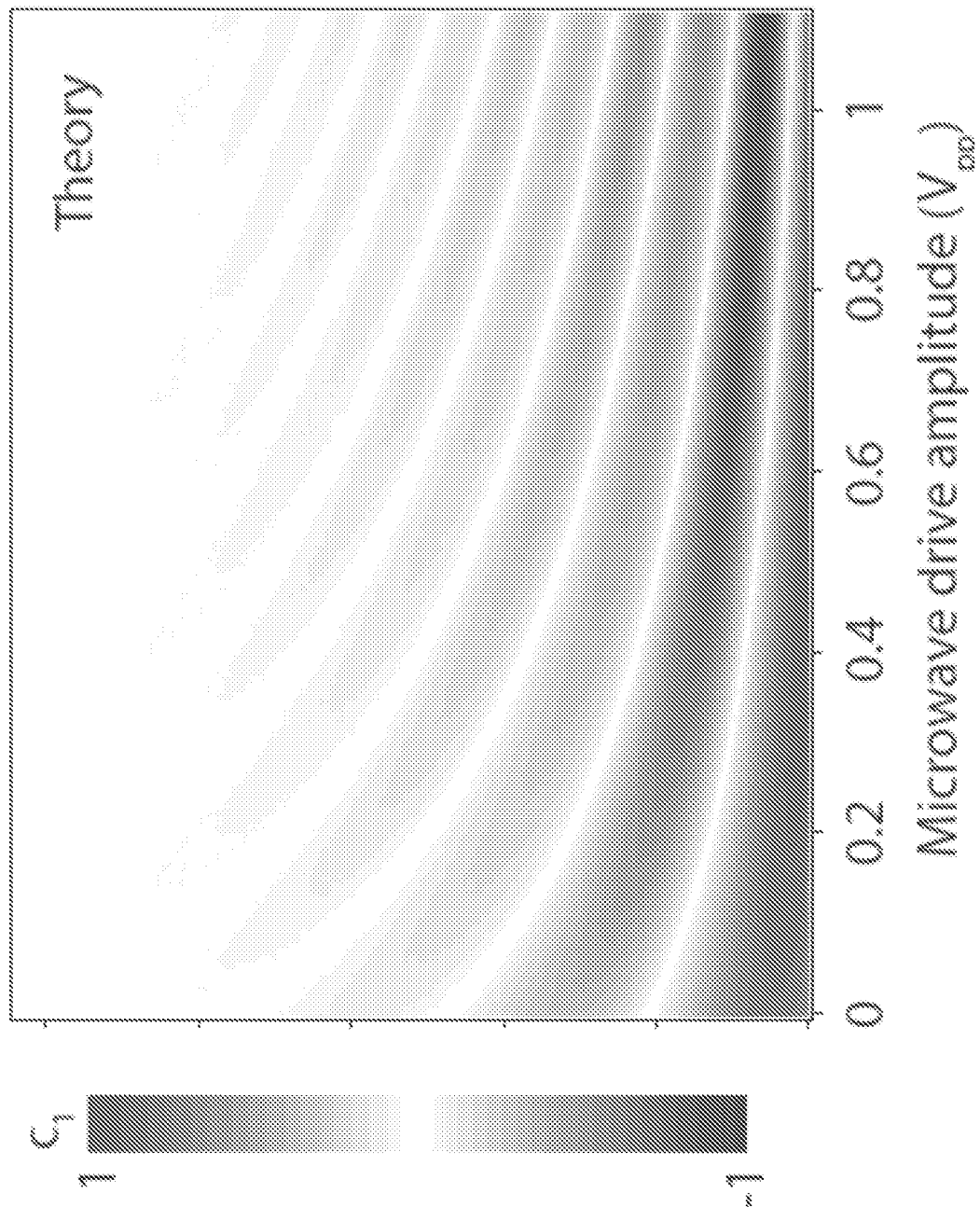
Figure 7C:
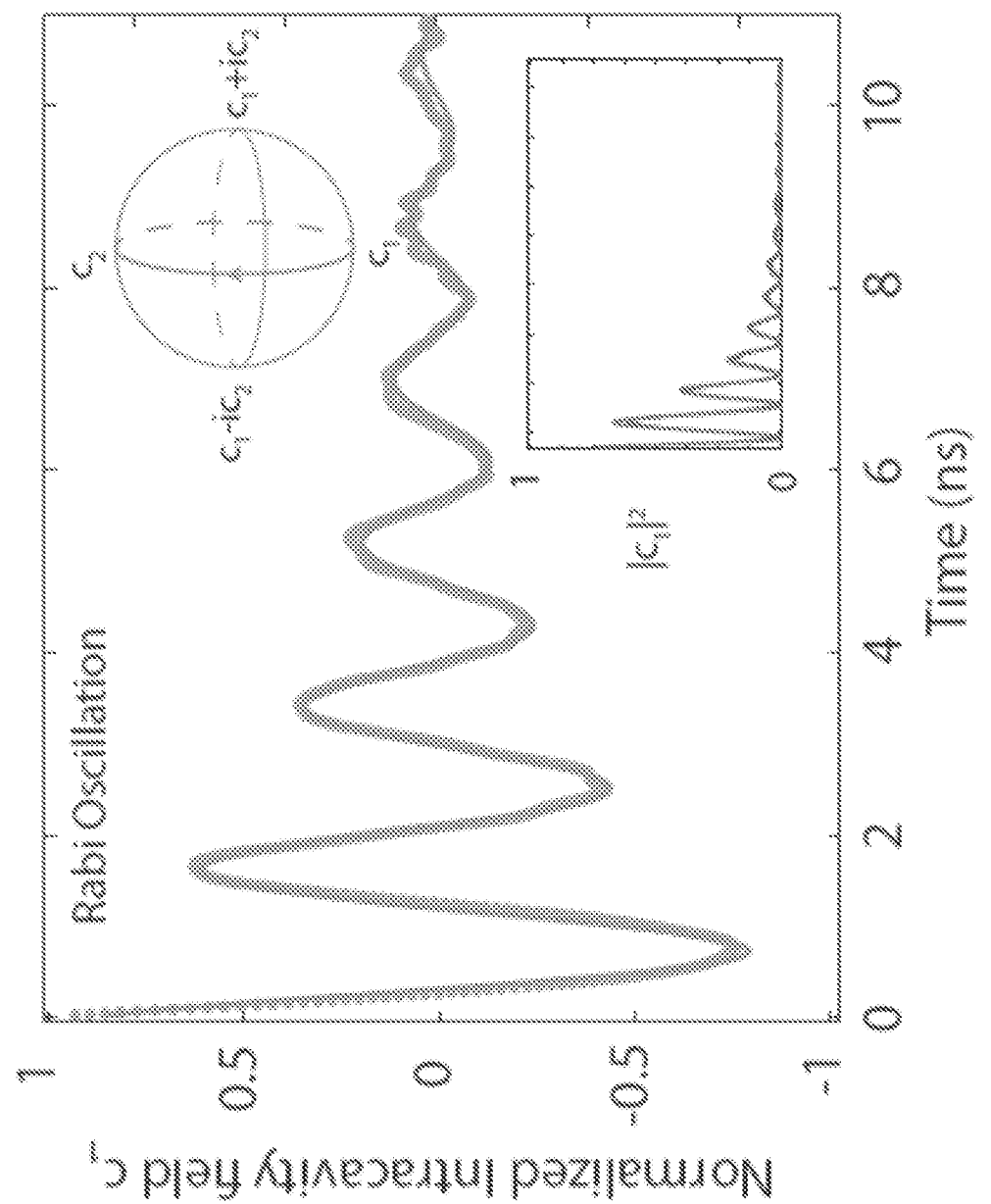
Figure 7D:
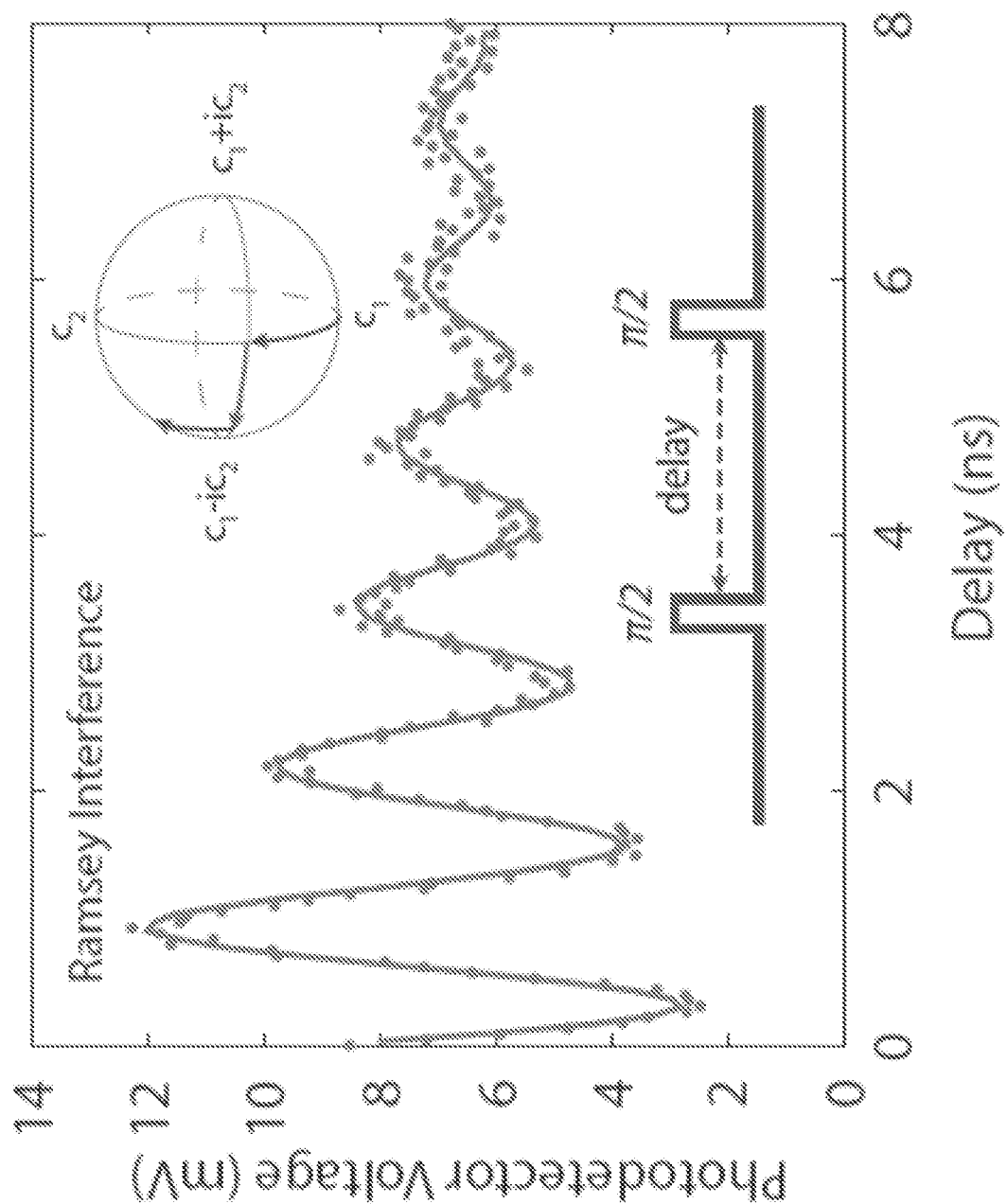

The dynamics of the photonic two-level system can be directly visualized through the time evolution of the out-put photons. A microwave field is applied at the mode splitting frequency to drive Rabi oscillations between the two levels of the photonic molecule (FIG. 7), similar to the Autler-Townes splitting measurements (FIG. 6B). The Rabi oscillation corresponds to a rotation along the real axis of the energy Bloch sphere and indicate that the light tunnels back and forth between the two optical energy states before it eventually decoherers due to the cavity photon loss (life time~1.6 ns). To study the Rabi oscillation, the system is initialized by coupling a CW laser into the S mode and measure the real-time optical transmission as the microwave drive is turned on. A large range of Rabi frequencies is achievable with low applied voltages (FIG. 7A) to be in excellent agreement with theoretical predictions (FIG. 7B). In particular, for a peak drive voltage of Vp=1.1 V, coherent Rabi oscillation is observed with a frequency of 1.1 GHz, being 16% of the initial mode splitting. Even stronger driving regimes, where the Rabi frequencies are close or even exceed the level splitting, are accessible in this system, thus enabling exploration of the extreme conditions where the rotating-wave approximation completely breaks down.

To show the phase coherence in the photonic two-level system, photonic Ramsey interference is measured by driving the system with detuned microwave pulses at 7.8 GHz. After initializing the system in the S mode, a microwave π/2 pulse is applied to transform the optical field into a superposition of the two states. As the microwave is turned off for a time period of τ, the superposition state precesses along the equator of the Bloch sphere at a rate determined by the microwave detuning δ. After sending another microwave π/2 pulse, the photons are rotated to different energy states, determined by the delay τ, and measured using a photodetector. The result is the Ramsey interference shown in FIG. 7D. The phase coherence time of the two energy levels obtained in this measurement is in good agreement with that obtained from the Rabi oscillation (~1.6 ns).

FIG. 8 illustrates on-demand storage and retrieval of light using a photonic dark mode. Referring to FIG. 8A, the photonic molecule is programmed so that the resonance frequency of ring 801 is different from ring 802, resulting in bright and dark modes. The former is localized mainly in ring 801 while the latter in ring 802. As a result, bright mode can be accessed from the optical waveguide 803, while the dark mode cannot (forbidden by geometry). Referring to FIG. 8B, a microwave field applied to the system can induce an effective coupling between bright and dark modes, indicated by the avoided crossing observed in the optical transmission spectrum. Referring to FIG. 8C, light can be deterministically stored and retrieved using the bright-dark mode pair and microwave control. Photons are coupled to ring 801 through fixed waveguide coupling. A microwave π pulse is applied to temporarily open a channel that transfers light from the bright to the dark mode. As the microwave is turned off, photons are restricted from any external waveguide coupling. After a certain desired storage time, a 2nd microwave π pulse retrieves the photon from the dark to the bright mode and the light is transferred back to the optical wave guide. γ is the decay rate of the bright optical mode, $γ_i$ and $γ_{ex}$ are the intrinsic damping and waveguide coupling rate respectively. Referring to FIG. 8D, the retrieved light from the dark mode measured at different time delays. Inset: the extracted intensity of the retrieved light shows nearly twice the lifetime of the critically coupled bright mode. This is because the lifetime of the bright mode is affected by the waveguide coupling, while the lifetime of the dark mode is determined by the intrinsic losses of the resonator only, as it is decoupled from the input waveguide. NT stands for normalized transmission.

Figure 8A:
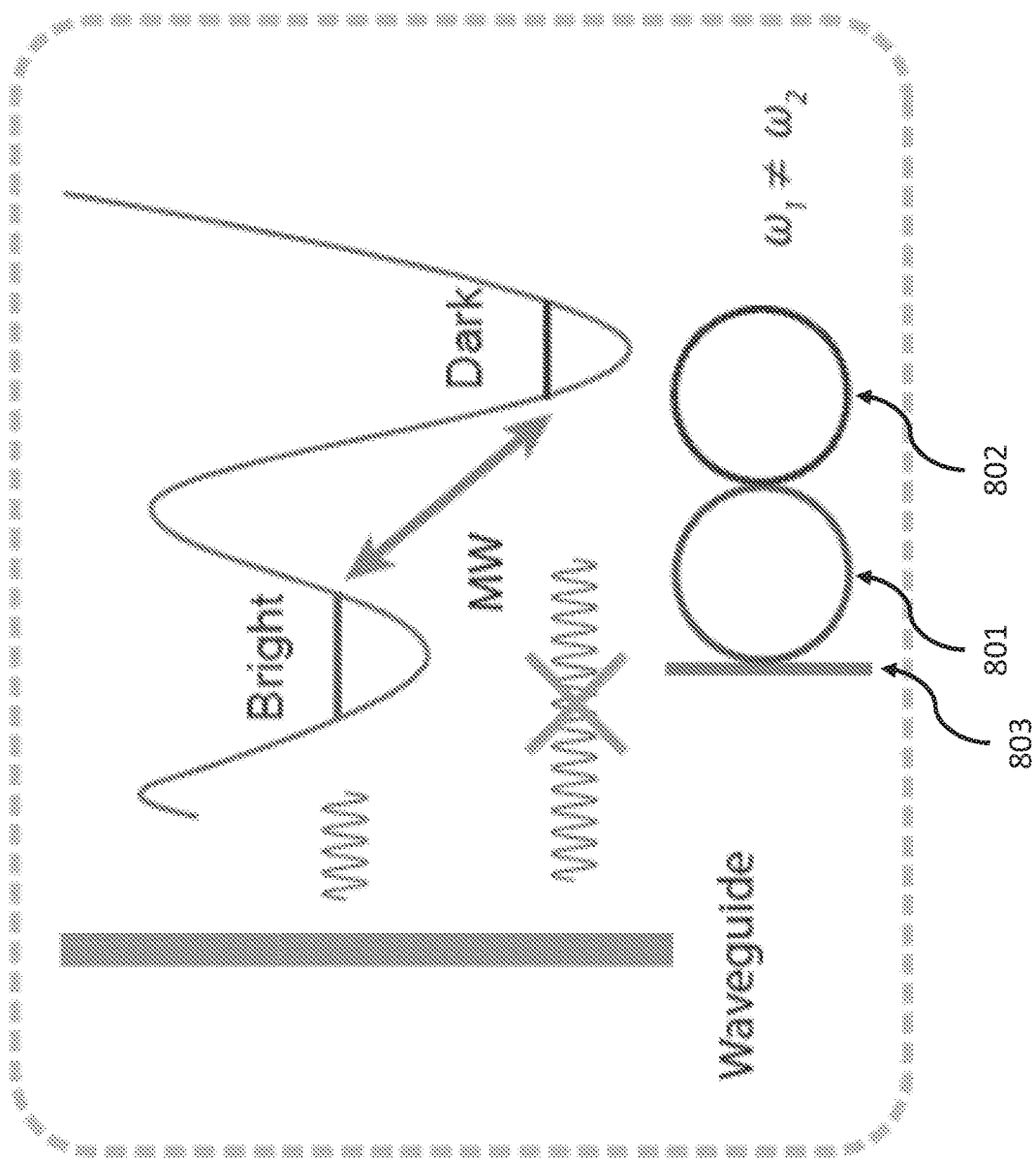
FIGS. 8A-D illustrate on-demand storage and retrieval of light using a photonic dark mode according to embodiments of the present disclosure.
Figure 8B:
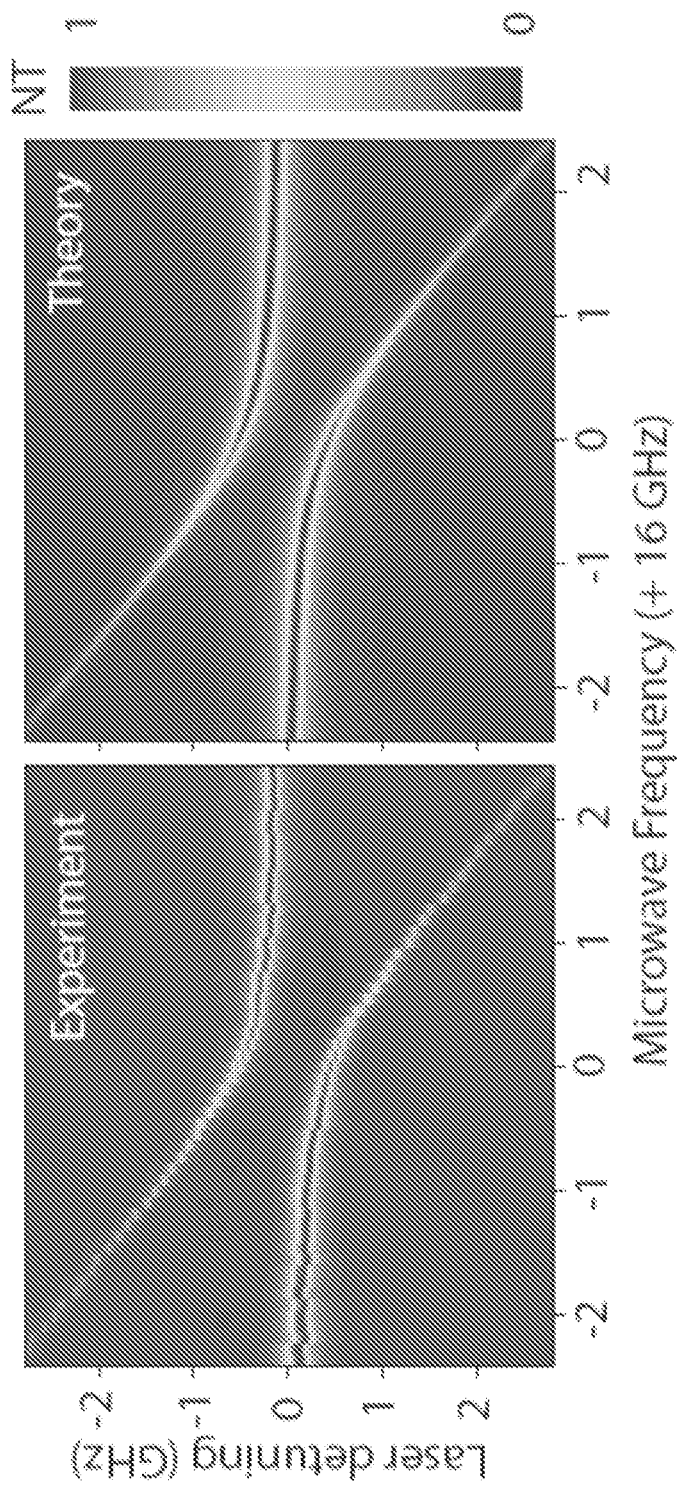

The ability to perform arbitrary photon state transformations in the frequency domain is leveraged to achieve on-demand photon storage and retrieval—useful for optical signal processing. The use of a dynamically-modulated resonator system can overcome a delay-bandwidth product constraint, enabling functionalities such as optical buffering. To enable controllable write and read of photons into a resonator and from an external waveguide, the optical coupling strength can to be altered faster than the cavity photon lifetime. To achieve this, a large DC bias voltage (15 V) is applied to reconfigure the photonic molecule into a pair of bright and dark modes. In this limit, one of the modes is mainly localized in ring 801 (in FIG. 8A), and thus is still accessible to the input optical waveguide and is optically bright, while the other mode is mainly localized in ring 802 (in FIG. 8A) and thus is decoupled from the input optical waveguide by geometry and becomes optically dark. Optical access to the dark optical mode can be granted by applying a microwave signal with frequency matched to the difference between the two optical modes (FIG. 8A). The microwave modulation results in an effective coupling between the bright and the dark mode, which is directly observed from the avoided crossing in the spectrum of the bright optical mode (FIG. 8B).

Figure 8C:
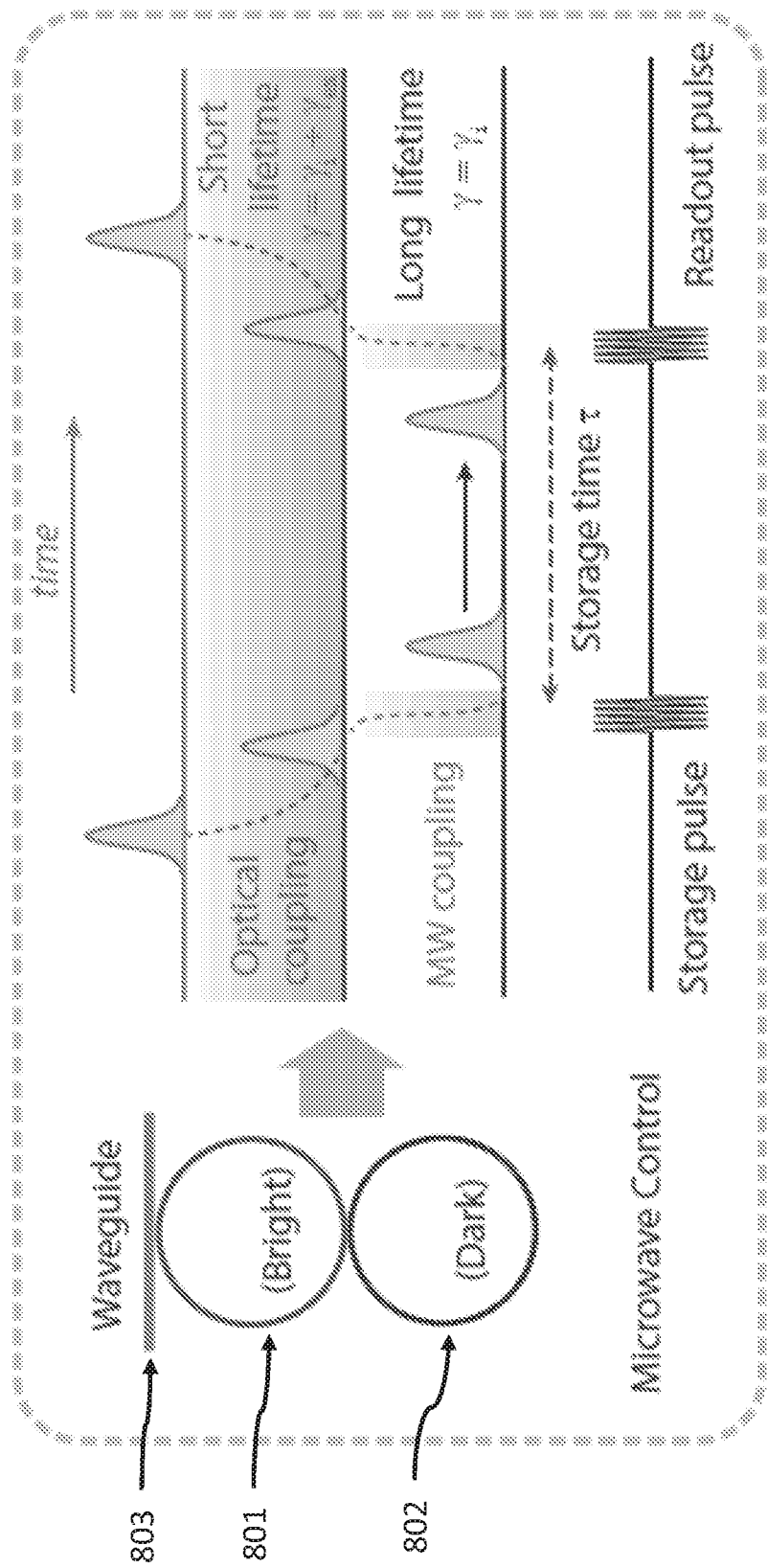
Figure 8D:
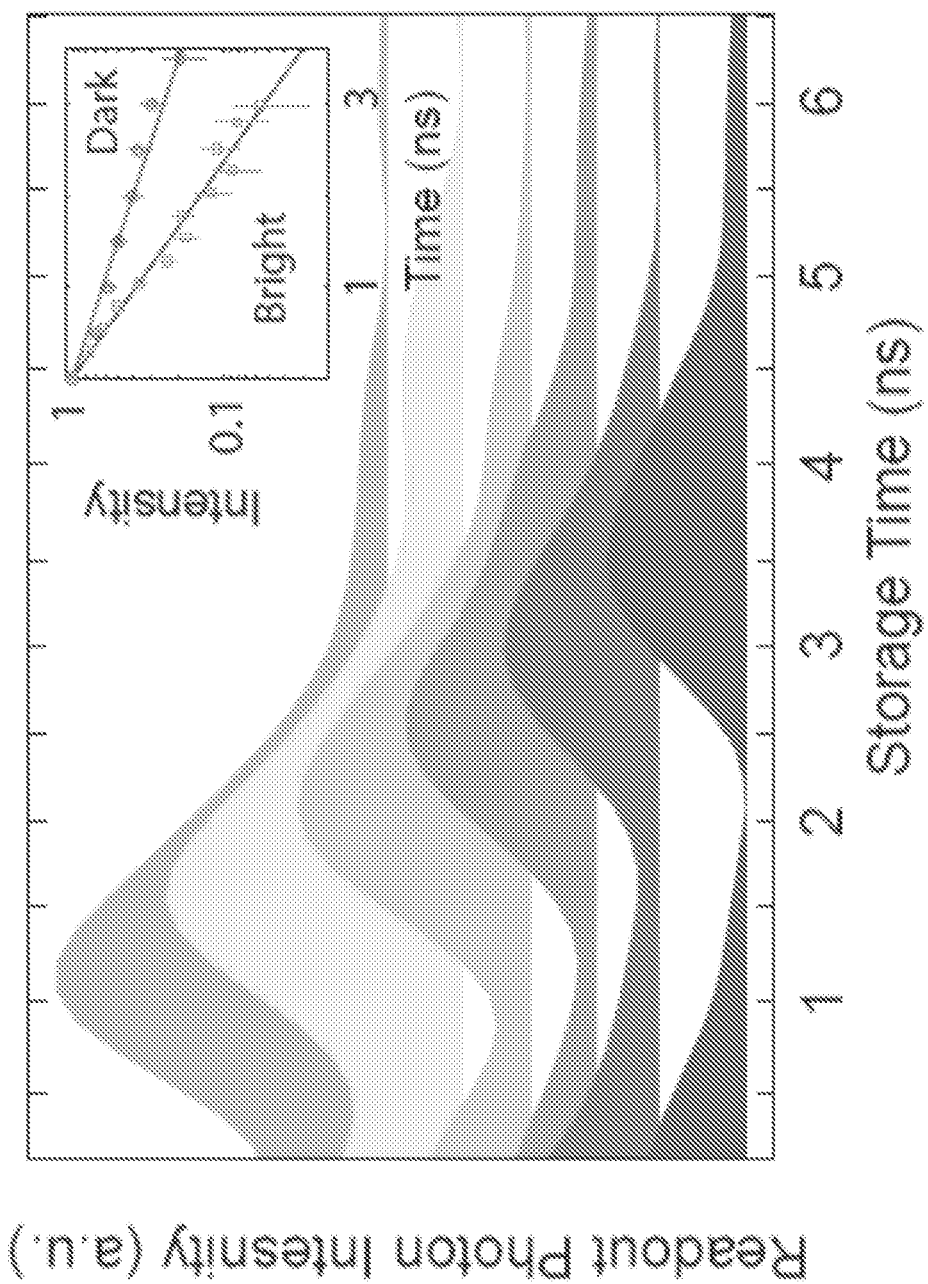
Figure 9A:
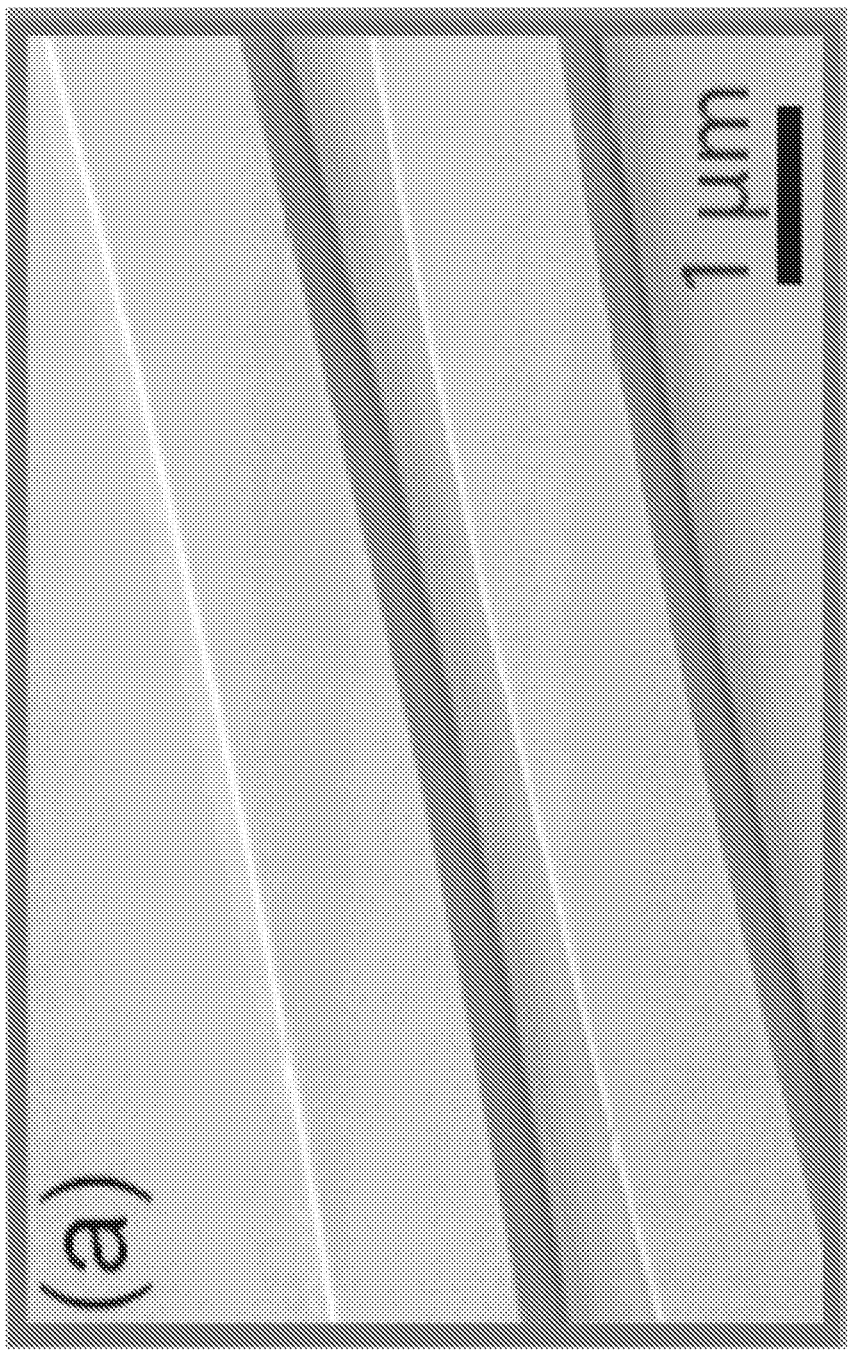
FIGS. 9A-D illustrate details of an exemplary device according to embodiments of the present disclosure.
Figure 9B:
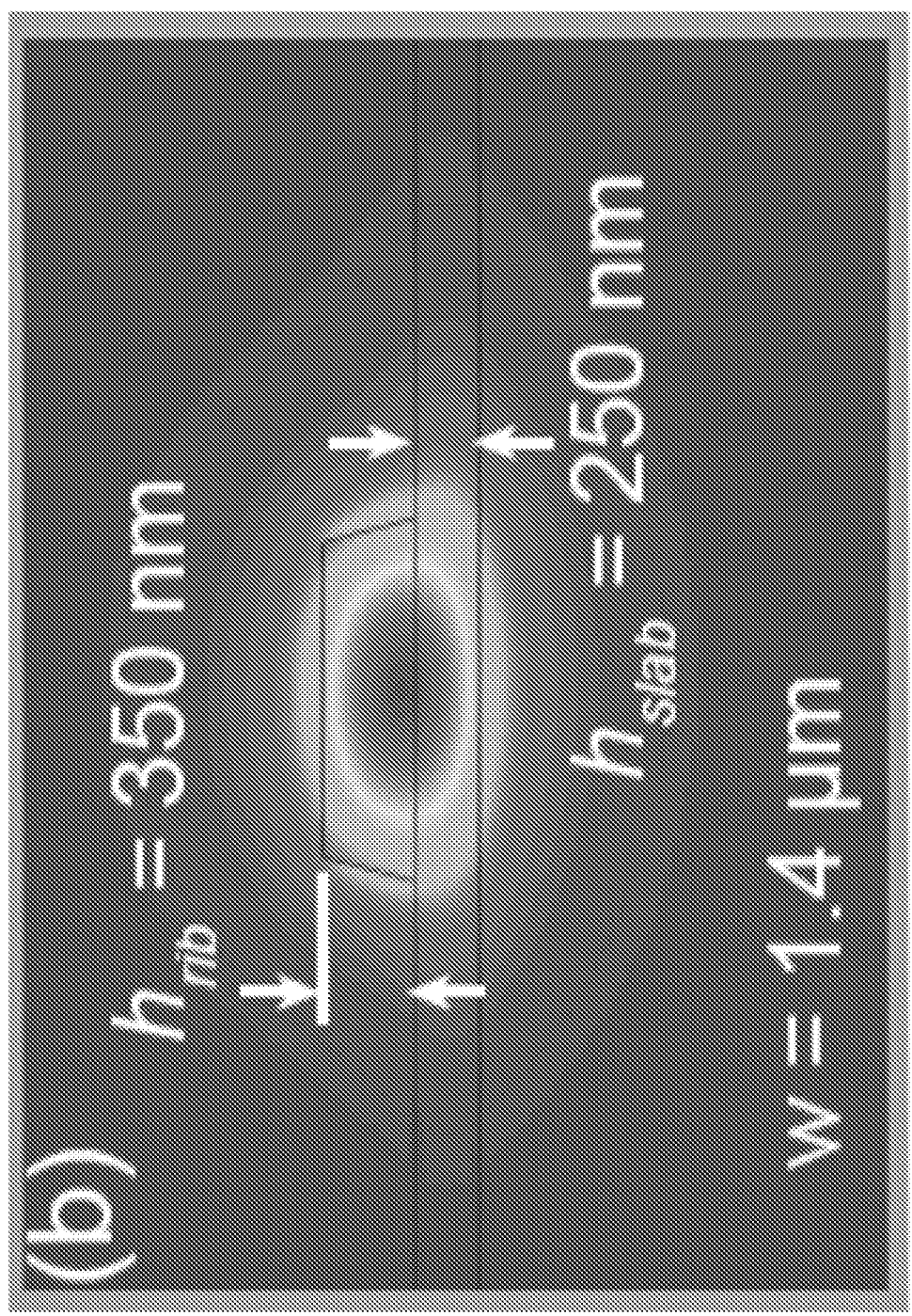
Figure 9C:
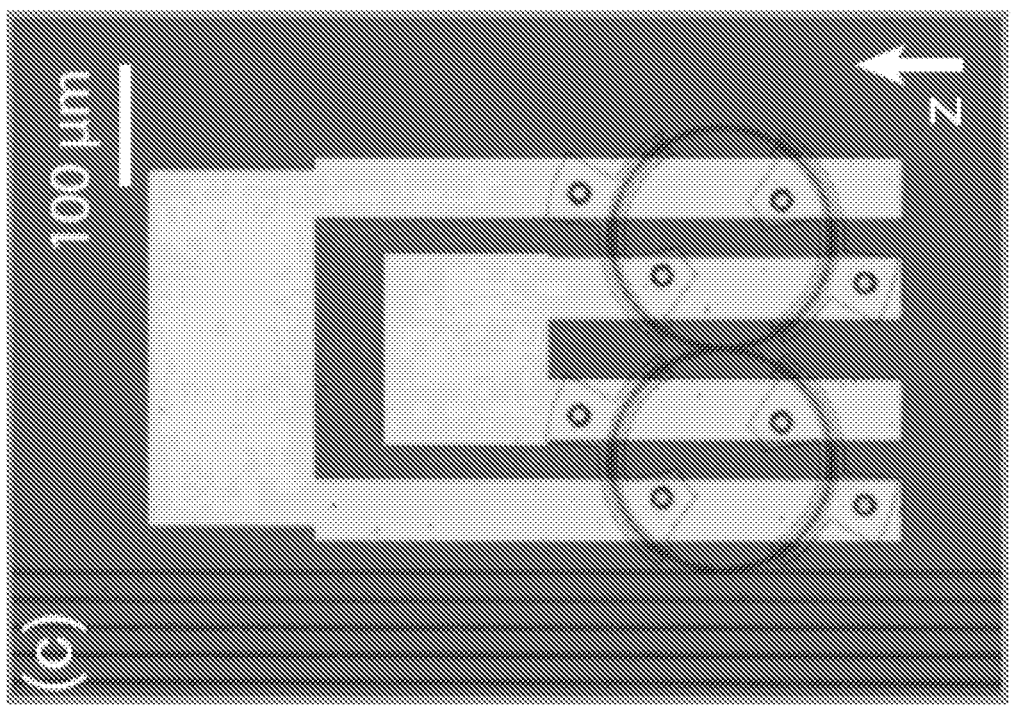
Figure 9D:
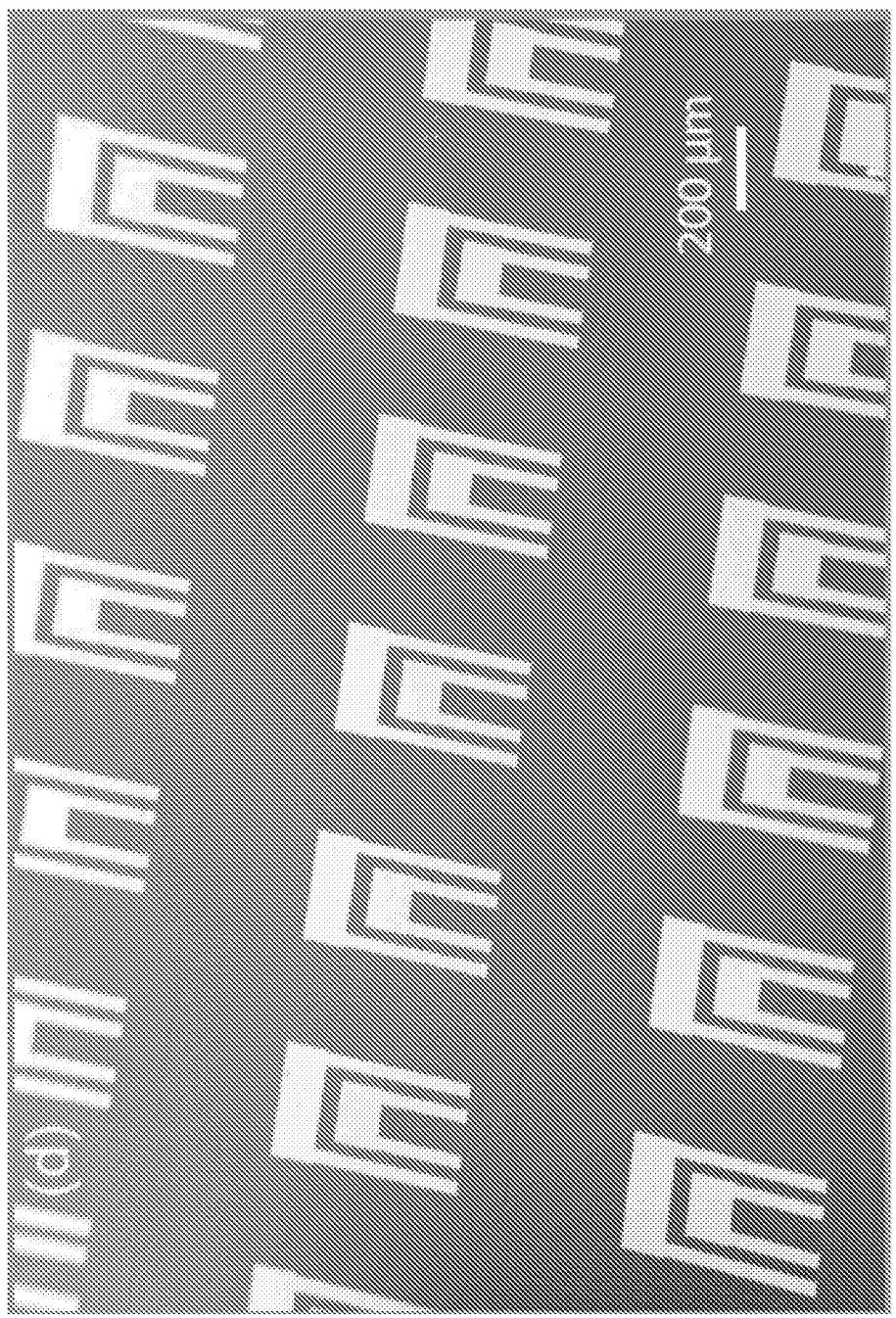

In this example, the bright mode is excited from the optical waveguide, and then a microwave π pulse is applied to switch light from the bright to the dark mode (FIG. 8C). Once the microwave signal is turned off, the photons are trapped in the dark mode and become decoupled from the waveguide leaving cavity intrinsic dissipation as the only photon loss mechanism. After a desired storage time, another microwave π pulse is applied to deterministically retrieve the photons from the dark mode back into the bright mode and then into the optical waveguide (FIG. 8C). Tracking the intensity of the retrieved optical pulsed stored in the dark mode, a dark mode lifetime of 2 ns is extracted, which is about two times of the lifetime of the critically coupled bright mode as expected (FIG. 8D). Further improving the quality factor of the integrated lithium niobate resonators towards its material limit (>109) can result in a tunable storage time up to a microsecond at room temperature.

This demonstration of the coherent and dynamic control of a two-level photonic molecule with microwave fields and on-demand photon storage and retrieval provides a useful paradigm of control over photons. These results enable integrated electro-optic coherent manipulation of photonic states and energies, and have applications in signal processing and quantum photonics. With microwave control and the integration of on-chip photonic components including filters, routers and modulators, photonic-electronic systems with advanced functionalities can be put in practice. Considering the high versatility and scalability of dynamically controlled two- and multi-level photonic systems, they enable photonic technologies including topological photonics, advanced photonic computation concepts, and on-chip optical quantum systems.

In various embodiments, devices are fabricated on single crystalline thin-film lithium niobate (LN) device layer bonded onto a silicon (Si) handle wafers with a 2 μm thick thermally grown silicon dioxide layer on top. Electron-beam (e-beam) lithography is used to realize optical waveguide and microresonator patterns in hydrogen silsequioxane (HSQ) e-beam resist. The patterns is then transferred into the LN layer using argon plasma etching in a standard inductively couple plasma reactive ion etching (ICP-RIE) tool. The etched depth is 350 nm leaving a 250 nm LN slab behind. The slab allows for efficient electrical field penetration into the waveguide core region. The first layer of the gold interconnects is patterned using e-beam lithography and the metals are deposited with e-beam evaporation methods and lift-off processes. Next, a 1.6 μm silicon dioxide layer is deposited on top using plasma enhanced physical vapour deposition (PECVD) method. Finally, metal vias and the top metal layer are realized using photolithography followed by e-beam evaporation and lift-off processes.

The light from a tunable telecom wavelength laser (SANTEC TS510) is launched into, and collected from, the LN waveguides using a pair of lensed optical fibres. The microwave control signals are generated from an arbitrary waveform generator (AWG, TEKTRONIX 70001A), before they are sent to electrical amplifiers. Electrical circulator or isolators are used to prevent multiple electrical reflections. For the Rabi oscillation measurements, the electric field amplitude (c1) in the S mode is measured by interfering the light out-coupled from the double-ring system with the pump light in the optical waveguide. The interference produces a homodyne signal for c1 that is sent to a 12 GHz photodiode (Newport 1544A), and due to the optical frequency difference, the rapid interference signal between the pump light and c2 can be filtered out electrically using a low-pass filter. For the Ramsey measurements, the optical power is sampled after the 2nd π/2 pulse using the fast photodiode. For the photon storage measurements, the pump light is synchronously turned off with the first π/2 pulse allowing for direct power readout of the retrieved light and prevent pump further leaking into the bright mode. The modulation on the pump signal is achieved by an external electro-optic modulator synchronized with the microwave control signals.

FIG. 9 illustrates details of an exemplary device according to embodiments of the present disclosure. FIG. 9A is a scanning electron microscope (SEM) image of the gap between the coupled microring resonators. FIG. 9B is a cross-section of the optical mode profile in the ring resonator. FIG. 9C is a microscope image of the full device showing the double-ring and microwave electrodes. FIG. 9D is a SEM image of the array of double ring devices fabricated on a single chip.

The ring resonators of the photonic molecule have waveguide width of 1.4 μm and vary coupling gaps of ~700 nm. The coupling waveguides are 800 nm wide by 600 nm thick with a rib height of 350 nm and slab height of 250 nm. This ratio is chosen to ensure optimum electro-optic over-lap while still maintaining a tight bending radius.

The high frequency microwave electrodes are designed to achieve differential driving of the two resonators. As shown in FIG. 9, the top contact pad is connected to the bottom electrodes of the left ring and the top electrodes of the right ring (and vice versa for the bottom contact pad). Since the LN thin film is x-cut (extraordinary axis z in plane), such configuration allows the electrical field to be in the same direction on each ring, while opposite for the two rings. Here 60 programmable photonic molecules are patterned on a 10 mm by 8 mm thin film lithium niobate (LN) chip.

Figure 10:
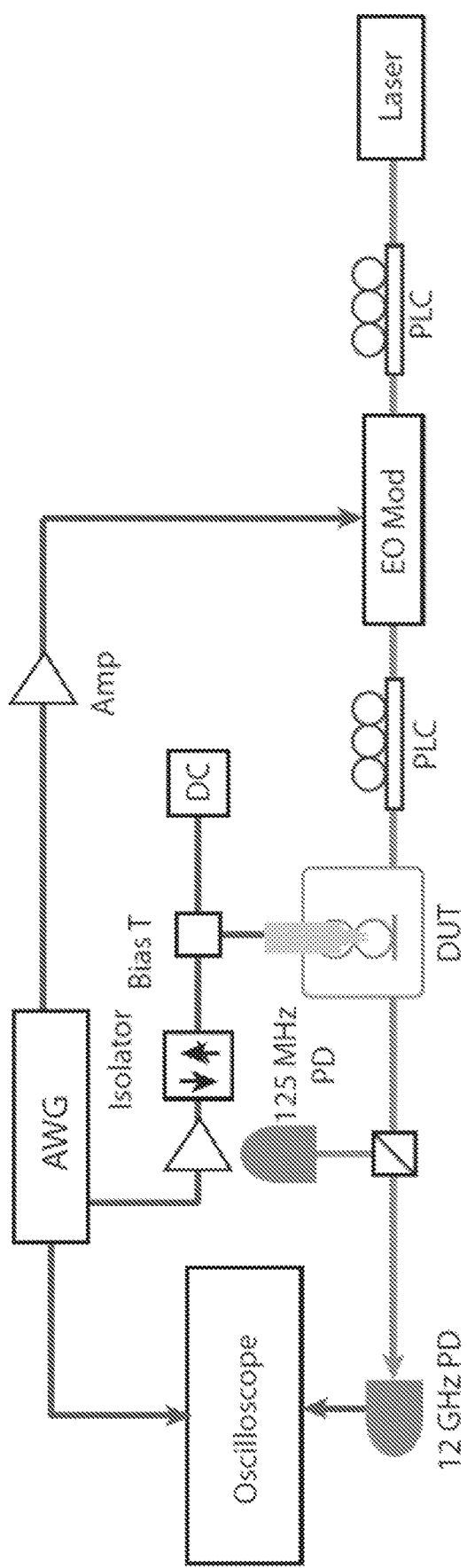
FIG. 10 illustrates an exemplary experimental setup according to embodiments of the present disclosure.

FIG. 10 illustrates an exemplary experimental Setup according to embodiments of the present disclosure. The device is optically pumped by a tunable telecom laser centered around 1630 nm. The light is sent through an external electro-optic modulator and polarization controllers before coupling into the chip with a lensed fiber. The output optical signal, also coupled with a lensed fiber, is sent to a 12 GHz photodetector (New focus 1811A). The converted electrical signal is directed to an oscilloscope. The microwave control signals are generated by an arbitrary wave generator (AWG, Tektronix 70001A) and amplified before sent on to the device. A bias T is used to allow DC control on the microresonators. An electrical isolator is used to capture the electrical reflection from the microresonators. The oscilloscope, device drive signals and modulator drive signals are all synchronized.

Figure 11:
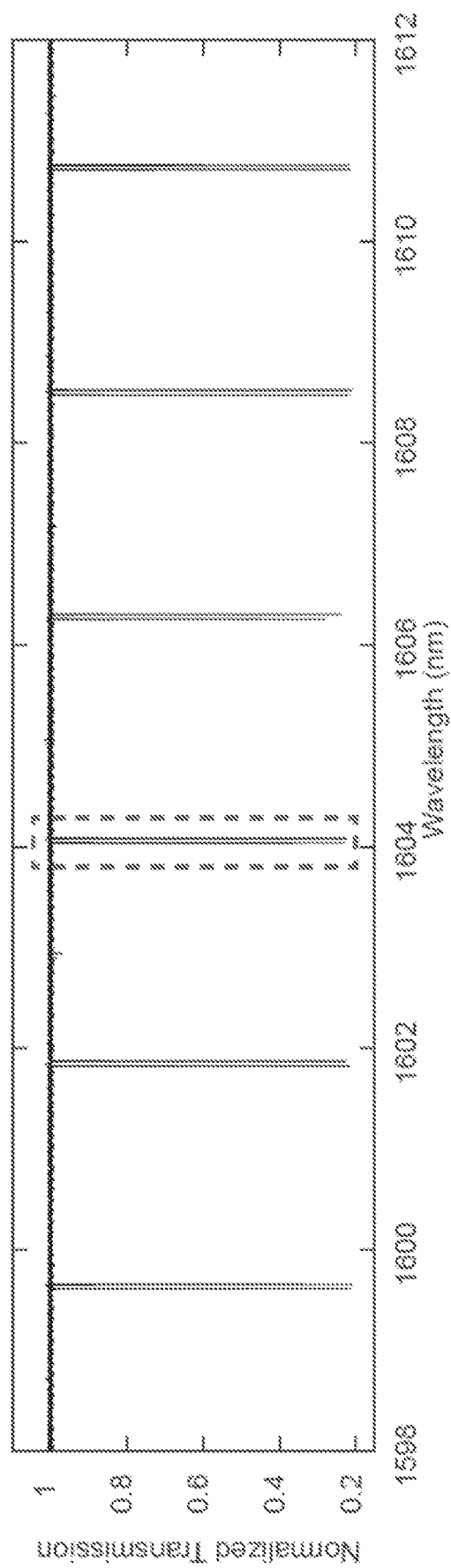
FIG. 11 illustrates a measured transmission spectrum according to an embodiment of the present disclosure.

FIG. 11 illustrates the measured transmission spectrum according to an embodiment of the present disclosure. Typical normalized transmission spectra of a double-ring resonator showing pairs of photonic two-level doublets, separated by ~2.2 nm of free-spectral-range.

The optical properties of the devices are characterized using a tunable telecom laser (Santec TSL-550). The polarization of the light is tuned to TE (in-plane of the chip) before sending into the chip with a lensed fiber. The DC transmission is measured on a 125 MHz photodetector (New Focus 1811A) and the fast oscillation signal is measured on a 12 GHz photodetector (New Focus 1544A) and a fast real-time oscilloscope (Tektronix MS071604C). FIG. 11 shows the normalized transmission spectrum of the photonic molecule, showing pairs of two-level resonances separated by the free-spectral-range of the microring resonator (~2.2 nm).

The microwave signals are prepared using an arbitrary waveform generator (Tektronix 70001A), which provides synchronized signals to drive the photonic molecule as well as an external modulator and the oscilloscope. The microwave driving signal for the photonic molecule is amplified and sent through an isolator to minimize reflection to the amplifier. A bias-T is used to coupled DC field into the resonator for fine tuning.

The nanophotonic two-level system under a coherent microwave drive can be described by a Hamiltonian with the form $$\hat{H} = \omega_1 a_1^\dagger a_1 + \omega_2 a_2^\dagger a_2 + \mu(a_1^\dagger a_2 + a_1 a_2^\dagger) + \Omega(a_1^\dagger a_1 - a_2 a_2^\dagger)\cos(\omega_m t) \quad \text{Equation 1}$$

where $a_1$ ($a_1^\dagger$) and $a_2$ ($a_1^\dagger$) and are the annihilation (creation) operators of the two optical modes of the respective microresonator, $\mu$ is the coupling strength between the two optical resonators, $\Omega = gV0$ is the interaction strength of microwave field to the optical resonator, determined by the coupling strength g and microwave peak amplitude V0. $\omega_m$ is the frequency of the microwave modulation.

When the resonant frequencies of the two resonators are identical, i.e. $\omega_1 = \omega_2 = \omega_0$, Equation 1 can be expressed as $$\hat{H} = \omega_+ c_1^\dagger c_1 + \omega_- c_2^\dagger c_2 + \Omega(c_1^\dagger c_2 + c_1 c_2^\dagger)\cos(\omega_m t) \quad \text{Equation 2}$$

where $$\omega_\pm = \omega_0 \pm \mu, \; c_1^{(\dagger)} = \frac{1}{\sqrt{2}}\left(a_1^{(\dagger)} + a_2^{(\dagger)}\right) \text{ and}$$

$$c_2^{(\dagger)} = \frac{1}{\sqrt{2}}\left(a_1^{(\dagger)} - a_2^{(\dagger)}\right),.$$

To simplify the system, a unitary transformation $U_1 = e^{(i\omega_+ c_1 c_1^\dagger t + \omega_- c_2 c_2^\dagger t)}$ and the rotating wave approximation (RWA) are applied, obtaining $$U_1 \hat{H} U_1^\dagger = \frac{\Omega}{2}\left(c_1^\dagger c_2 e^{i\delta t} + c_1 c_2^\dagger e^{-i\delta t}\right) \quad \text{Equation 3}$$

where the microwave detuning $\delta = \omega_m - \Delta\omega$ and $\Delta\omega$ is the frequency difference between c1 and c2. Equation 3 is equivalent to the time independent Hamiltonian $$\hat{H} = \frac{\delta}{2} c_1^\dagger c_1 - \frac{\delta}{2} c_2^\dagger c_2 + \frac{\Omega}{2}\left(c_1^\dagger c_2 + c_1 c_2^\dagger\right) \quad \text{Equation 4}$$

The following equations of motion are obtained using input-output theory from Equation 4, $$\frac{d}{dt}\begin{pmatrix} c_1 \\ c_2 \end{pmatrix} = \begin{pmatrix} -i\frac{\delta}{2} & -i\frac{\Omega}{2} \\ -i\frac{\Omega}{2} & i\frac{\delta}{2} \end{pmatrix}\begin{pmatrix} c_1 \\ c_2 \end{pmatrix} \quad \text{Equation 5}$$

Figure 12A:
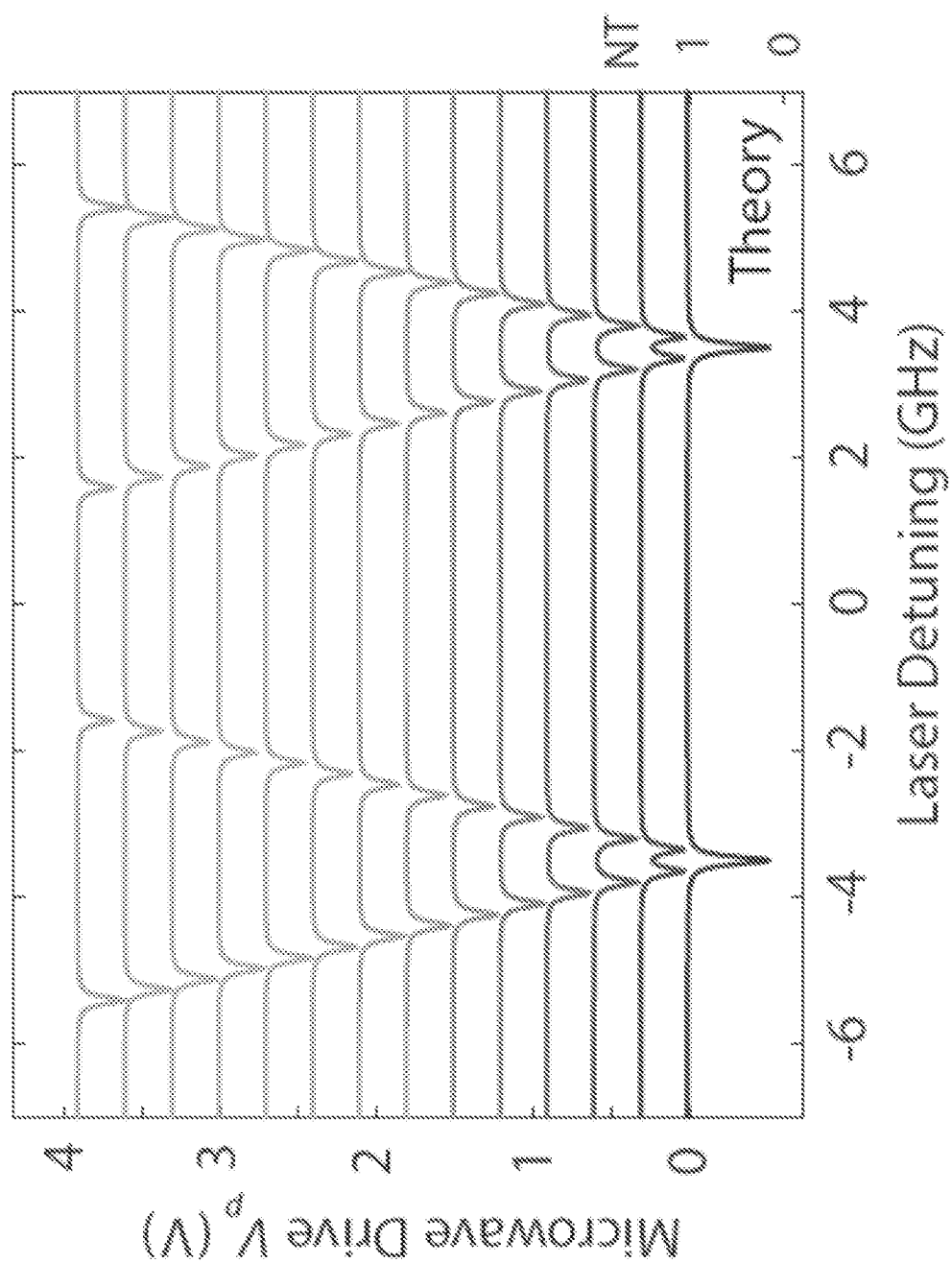
FIGS. 12A-B illustrates the calculated optical transmission spectrum for Autler-Townes (AT) splitting and AC Stark shift according to embodiments of the present disclosure.
Figure 12B:
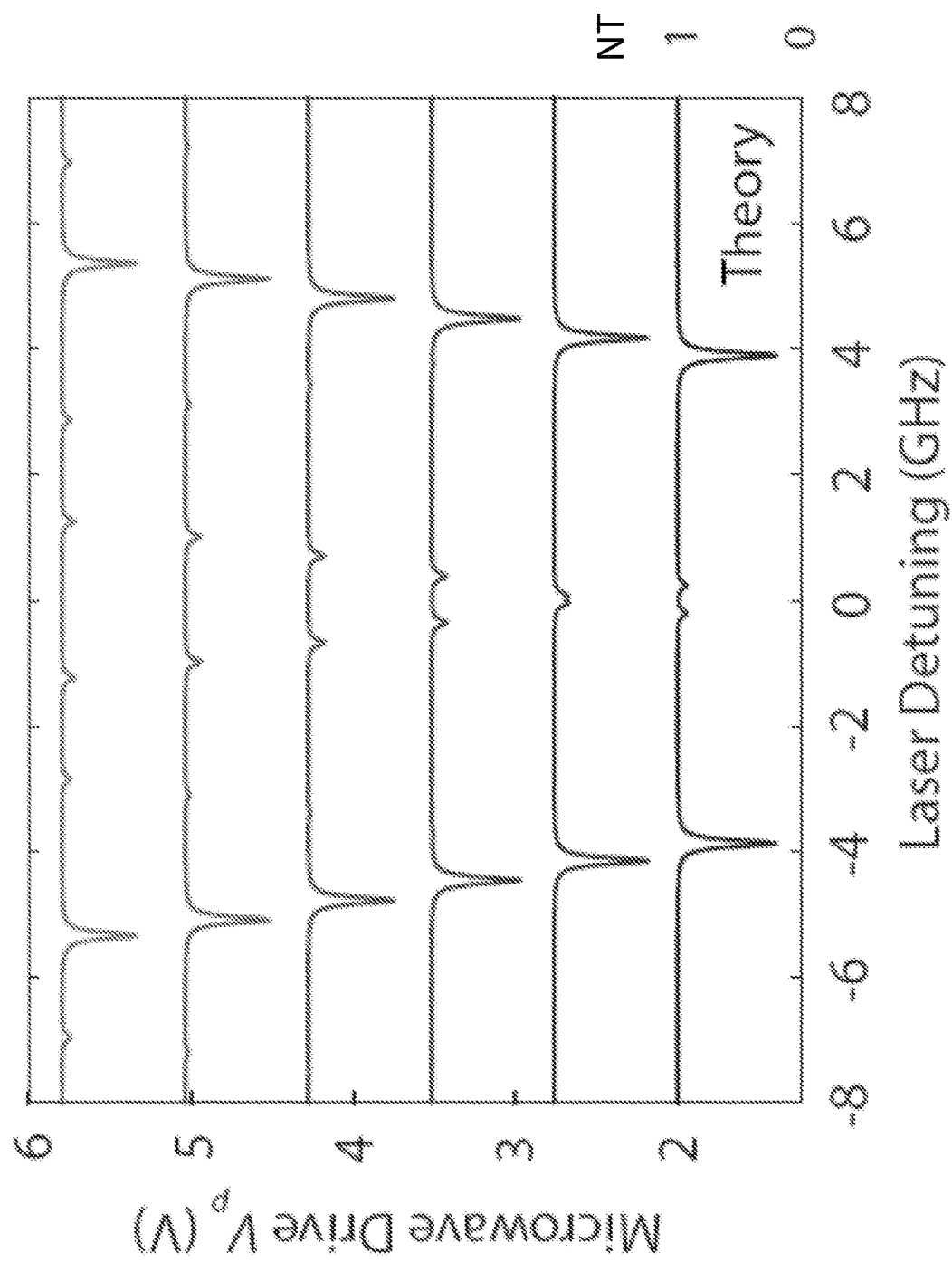

FIG. 12 illustrates the calculated optical transmission spectrum for Autler-Townes (AT) splitting and AC Stark shift. FIG. 12A shows simulated AT spectrum with full mode described in Equation 2. FIG. 12B shows simulated AC Stark shift spectrum with full mode described in Equation 2.

Under a continuous wave microwave modulation with frequency close to the optical two-mode splitting, each resonance of c1, c2 will further split into two dips with splitting frequency $$W = \sqrt{(\Omega^2 + \delta^2)} \quad \text{Equation 6}$$

obtained by diagonalizing the coupling matrix $$M = \begin{pmatrix} -i\delta/2 & -i\Omega/2 \\ -i\Omega/2 & i\delta/2 \end{pmatrix}$$

from Equation 5.

For the Autler-Townes splitting measurement data shown in FIG. 6A and simulation shown in FIG. 12A, the microwave modulation signal is on-resonance with the optical two-mode splitting, $\delta = 0$, with $W = \Omega = gV0$.

When the microwave frequency detuning to the two-mode resonances is much larger than the driving strength ($\delta \gg \Omega$), the microwave modulation behaves as a weak perturbation. This perturbation induces a shift of the optical energy levels. Applying the second-order perturbation theory yields $$M \approx \begin{pmatrix} -i\left(\frac{\delta}{2} + \frac{\Omega^2}{4\delta}\right) & \\ & -i\left(-\frac{\delta}{2} - \frac{\Omega^2}{4\delta}\right) \end{pmatrix} \quad \text{Equation 7}$$

In the static frame we obtain the shifted frequency $$\omega'_\pm = \omega_\pm \mp \frac{\Omega^2}{4\delta} \quad \text{Equation 8}$$

In the experimental measurements in FIG. 6B and FIG. 12 $\delta < 0$ where the two energy levels of c1, c2 moves away from each other. For a blue-detuned microwave drive signal, $\delta > 0$, the two energy levels will move towards to each other.

To study the dynamics of the photonic two-level system, the equations of motion Equation 5 may be considered with optical loss and laser input fields. For a single tone optical input on resonance with c1, the equations of motion are $$\dot{c}_1 = \left(-i\frac{\delta}{2} - \frac{\gamma}{2}\right)c_1 - i\frac{\Omega}{2}c_2 - \sqrt{\gamma_{ex}/2}\, s_{in} \quad \text{Equation 9}$$

$$\dot{c}_2 = \left(i\frac{\delta}{2} - \frac{\gamma}{2}\right)c_2 - i\frac{\Omega}{2}c_1 - \sqrt{\gamma_{ex}/2}\, s_{in} e^{i\omega_m t} \quad \text{Equation 10}$$

where $\gamma$ is the total decay rate of the modes c1,2, $\gamma_{ex}$ is the waveguide coupling rate to mode a1 and sin is the input laser field. After dropping the fast rotating terms with frequency of $\omega_m$, we obtain the dynamical solution of c1 and c2, $$c_1 = c_{10} e^{-\frac{\gamma}{2} t}\left(\cos\frac{W}{2}t - i\frac{\delta}{W}\sin\frac{W}{2}t\right) \quad \text{Equation 11}$$

$$c_2 = -i c_{10} e^{-\frac{\gamma}{2} t} \frac{\Omega}{W}\sin\frac{W}{2}t$$

where $$c_{10} = \frac{\sqrt{\gamma_{ex}/2}\, s_{in}}{-i\Delta - \gamma/2}$$

is the steady state amplitude in mode c before the microwave is turned on and $\Delta$ is the laser detuning. Here $W = \sqrt{\Omega^2 + \delta^2}$ is the Autler-Townes splitting frequency as in Equation 6 and is also the Rabi oscillation frequency. The output power from the waveguide is then $$P_{out} = |s + \sqrt{\gamma_{ex}}\, a_1|^2 \qquad \text{Equation 12}$$
$$= |s + \sqrt{\gamma_{ex}/2}\,(c_1 + c_2 e^{i\omega_m t})|^2$$

Substitute Equation 9 into the expression of the output power and set $\delta=0$, yields $$P_{out} = P_{in}\left|1 - \frac{2\gamma_{ex}}{\gamma} e^{-\frac{\gamma}{2}t}\left(\cos\frac{W}{2}t\right)\right|^2 \qquad \text{Equation 13}$$

where Pin=$|s|^2$ and we made the approximation to drop the fast rotating terms of $c_2$ at ~7 GHz, as we restrict our measurement bandwidth to ~2 GHz. The intra-cavity field can therefore be directly calculated from the output intensity by $c_1 = (1 - \sqrt{P_{out}/P_{in}}) \times \gamma/2\gamma_{ex}$ Therefore the real-time AC signal on the photodetector is directly related to the intracavity field c1. FIG. 13 shows the full numerical solution as of Equation 2, the approximated solution Equation 11 and the measured photodetector voltage.

Figure 13A:
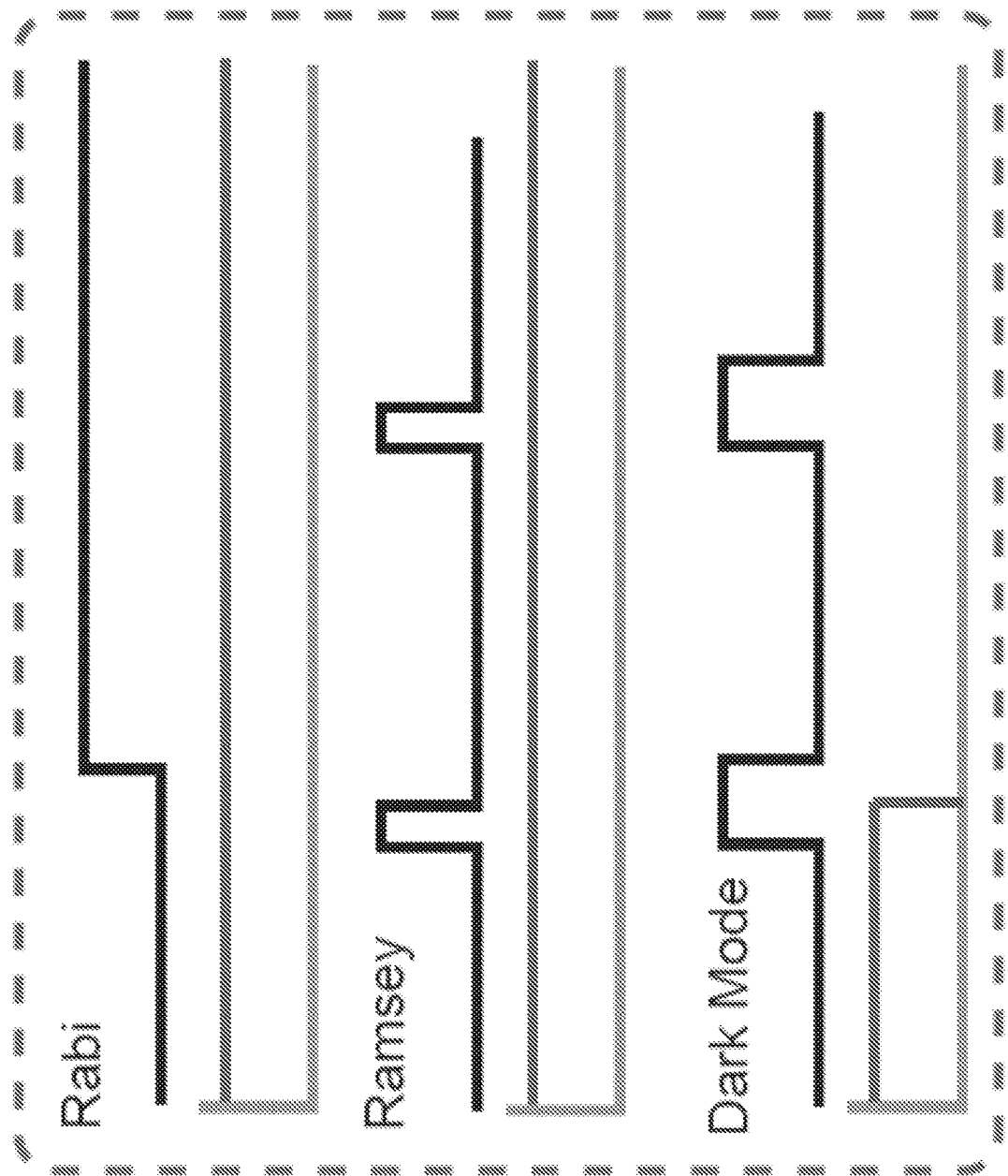
FIGS. 13A-B illustrate Rabi oscillation, Ramsey interference and dark mode measurements according to embodiments of the present disclosure.
Figure 13B:
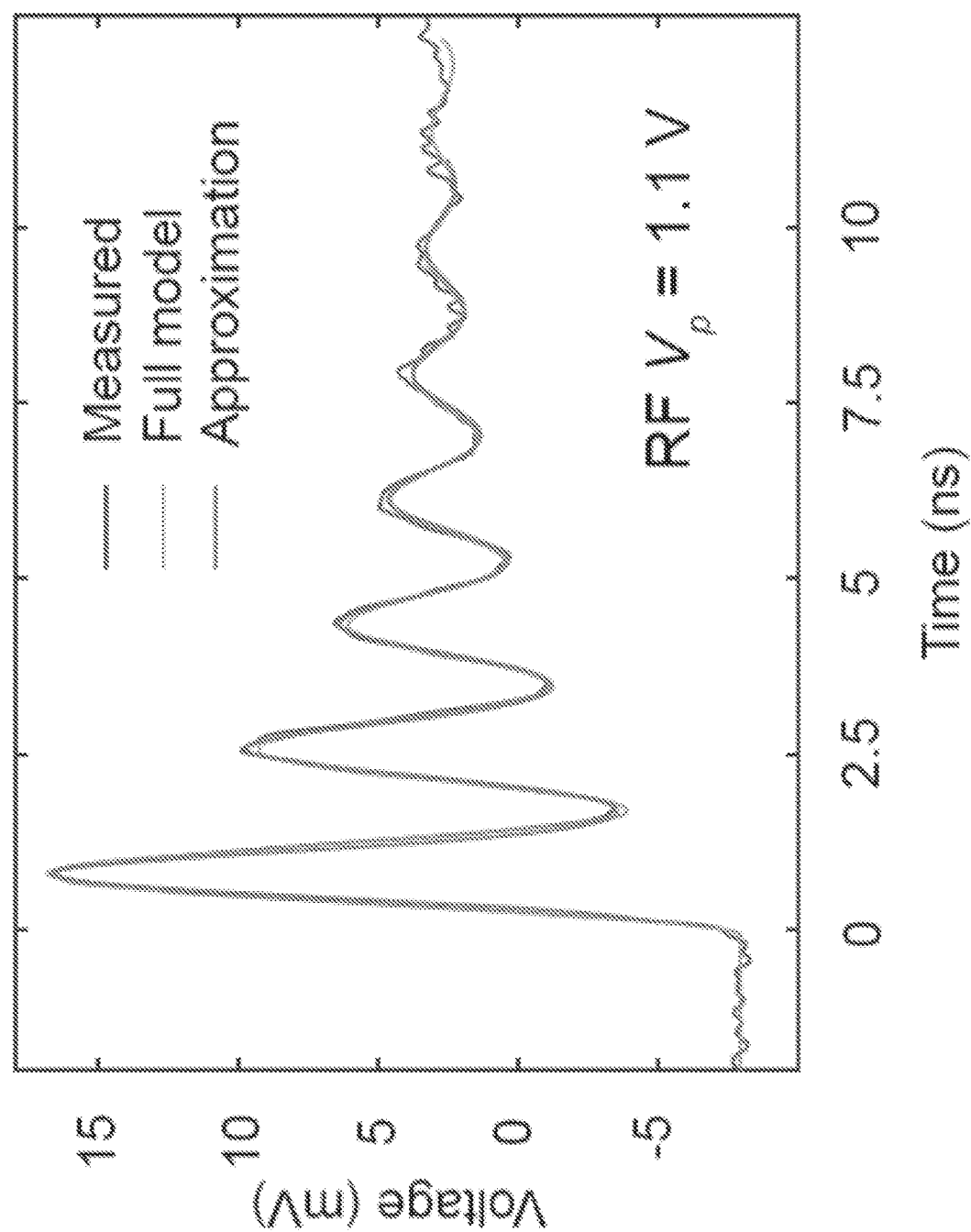

FIG. 13 illustrates Rabi oscillation, Ramsey interference and dark mode measurements. Referring to FIG. 13A, Rabi oscillation is measured in real-time as the microwave signal is turned on. The laser entering the cavity after the turn-on of the microwave signal is negligible as the split optical mode is transparent at the original laser wavelength. Ramsey interference is measured by two time-delayed microwave 7c/2 pulses. The optical power is recorded at the end of the second pulse. For the photonic dark mode measurements, the laser is turned off by an external electro-optic modulator for direct detection of optical powers and prevent further coupling into the bright mode during the delay time. Referring to FIG. 13B, comparison of the measured photodetector voltage, the simulated transmission of the full system and the calculated output from Equation 11.

The Ramsey interference is achieved by applying two microwave $\pi/2$ pulses separated by a time delay $\tau$. Here the microwave signal is detuned from the level-splitting by $\delta$. Using the protocol of Ramsey interference and Equation 7 and Equation 8, we can get the solution after two $\pi/2$ pulse as a function of time delay $\tau$:

$$c_1(2T+\tau) = e^{-\frac{\gamma}{2}(2T+\tau)} e^{-1\frac{\gamma}{2}\tau}\left[\frac{\Omega^2}{2W^2}(1 - e^{i\delta\tau}) - i\frac{\delta}{W}\right]c_{10} + \qquad \text{Equation 14}$$
$$e^{-\frac{\gamma}{2}T} e^{-1\frac{\gamma}{2}\tau}\left[1 - e^{-\frac{\gamma}{2}\tau}\right]\left[\frac{1}{\sqrt{2}} - i\frac{\delta}{W}\frac{1}{\sqrt{2}}\right]c_{10}$$

$$c_1(2T+\tau) = \qquad \text{Equation 15}$$
$$e^{-\frac{\gamma}{2}(2T+\tau)} e^{-1\frac{\gamma}{2}\tau}\left[\frac{\delta\Omega}{2W^2}(e^{i\delta\tau} - 1) - i\frac{\Omega}{2W}(e^{i\delta\tau} + 2)\right]c_{10} +$$
$$e^{-\frac{\gamma}{2}T} e^{-i\frac{\gamma}{2}\tau}\left[1 - e^{-\frac{\gamma}{2}\tau}\right]\left(-i\frac{\Omega}{W}c_{10}\right)$$

where from mode c1. Tis the duration of the $\pi/2$ pulse. The first terms in Equation 12 and Equation 13 represent the intra-cavity fields exist in the cavity prior to the arrival of the first $\pi/2$ pulse. The second terms are the leakage of the pump signal into the cavity during the delay, which contributes to a DC term. So the oscillation of the output signal $P_{out} = |s + \sqrt{\gamma_{ex}/2}(c_1 + c_2 e^{i\omega_m t})|^2$ rotating at with the frequency $\delta$ corresponds to the population of c1 after dropping the fast rotating terms related to c2.

In the case where a1 and a2 are far detuned by $\delta\omega \gg \mu$, as in the photon storage and retrieval measurements, we prefer to eliminate the coupling term $\mu(a_1^\dagger a_2 + a_1 a_2^\dagger)$ by a Bogoliubov transformation. Assuming a new basis of c1, c2 satisfying:

$$c_1 = va_2 - ua_1$$

$$c_2 = ua_2 + va_1 \qquad \text{Equation 16}$$

Since c1, c2 needs to satisfy the bosonic commutation relationship, we have the condition $u^2 + v^2 = 1$. So we set $$u = \cos\frac{\theta}{2},\ v = \sin\frac{\theta}{2}\ \text{with}\ \tan\theta = \mu/\delta\omega.$$

Then result of this transformation gives us a Hamiltonian for c1, c2:

$$\hat{H} = \omega_1 c_1^\dagger c_1 + \omega_2 c_2^\dagger c_2 + \Omega\cos(\omega_m t)\sin\theta(c_1 c_2^\dagger + c_1^\dagger c_2) + \Omega\cos(\omega_m t)\cos\theta(c_2^\dagger c_2 - c_1^\dagger c_1) \qquad \text{Equation 17}$$

where $\omega_1 = \omega_0 - \sqrt{\mu^2 + \delta\omega^2}$, $\omega_2 = \omega_0 + \sqrt{\mu^2 + \delta\omega^2}$. This Hamiltonian indicate that for c1, c2, the microwave modulation has a component that induces an exchange interaction $c_1 c_2^\dagger + c_1^\dagger c_2$ and a component that induces a frequency modulation $c_2^\dagger c_2 - c_1^\dagger c_1$.

As for the bright mode pair case discussed above, for a small bias $\mu \gg \delta\omega$, a1, a2 are nearly degenerate and in c1, c2 basis $$c_1 \approx -\frac{1}{\sqrt{2}}(a_1 + a_2) \qquad \text{Equation 18}$$

$$c_2 \approx \frac{1}{\sqrt{2}}(a_1 - a_2)$$

whereas in the case of a bright-dark optical mode pair, the bias voltage is high $\mu \ll \delta\omega$, a1, a2 have a large frequency difference and in c1, c2 basis, c1 is composed by a large part of a1 with small part of a2 and c2 has large part of a2 while has only small part of a1. That means:

$$c_1 \approx -\left(a_1 + \frac{|\mu|}{2\delta\omega}a_2\right) \qquad \text{Equation 19}$$

$$c_2 \approx -\left(a_2 - \frac{|\mu|}{2\delta\omega}a_1\right)$$

Here the conversion term is finite and is suppressed by a factor $$\sin\theta = \frac{\mu}{\delta\omega}$$

and the term $\Omega\cos(\omega_m t)\cos\theta(c_2^\dagger c_2 - c_1^\dagger c_1)$ is large, meaning that c1, c2 are being frequency modulated. However, Since the modulation frequency is orders of magnitudes larger than the bandwidth of the optical modes, we can neglect this term under high-Q approximation. The resulting Hamiltonian still has a similar form to the bright mode pairs, with a pre-factor sin θ in conversion efficiency.

$$\hat{H}_{dark} = \omega_1 c_1^\dagger c_1 + \omega_2 c_2^\dagger c_2 + \Omega\cos(\omega_m t)\sin\theta(c_1 c_2^\dagger + c_1^\dagger c_2) \quad \text{Equation 20}$$

Similar to the previous section, applying RWA and input-output theory to Equation 20 yields $$\dot{c}_1 = \left(-i\omega_1 - \frac{\gamma_1}{2}\right)c_1 - i\frac{\Omega}{2}\sin\theta c_2 - \sqrt{\gamma_{ex1}}\, s_{in} e^{-i\omega_L t} \quad \text{Equation 21}$$

$$\dot{c}_2 = \left(-i\omega_2 - \frac{\gamma_2}{2}\right)c_2 - i\frac{\Omega}{2}\sin\theta c_1 - \sqrt{\gamma_{ex2}}\, s_{in} e^{-i\omega_L t}$$

where $$\gamma_{1,2} = \gamma_i + \gamma_{ex1,2},$$

$$\gamma_{ex1} = \gamma_{ex}\cos^2\frac{\theta}{2},$$

$$\gamma_{ex2} = \gamma_{ex}\sin^2\frac{\theta}{2},$$

$\gamma_i$ is the internal loss of each ring and $\gamma_{ex}$ is the external loss of ring 1 to waveguide, and $\gamma_{ex1}$, $\gamma_{ex2}$ are the external losses of modes c1, c2 to waveguide. From these equations of motion, we see that at large bias voltages, $\gamma_{ex2} \to 0$ and the access of mode c2 to the external waveguide is effectively controlled by the microwave drive $\Omega$. At the same time, the life time for mode c2 becomes closer to that of the intrinsic cavity life time. Therefore, π-pulse control sequences can be implemented as described in the main text to achieve the on-demand photon-storage and retrieval.

Figure 14:
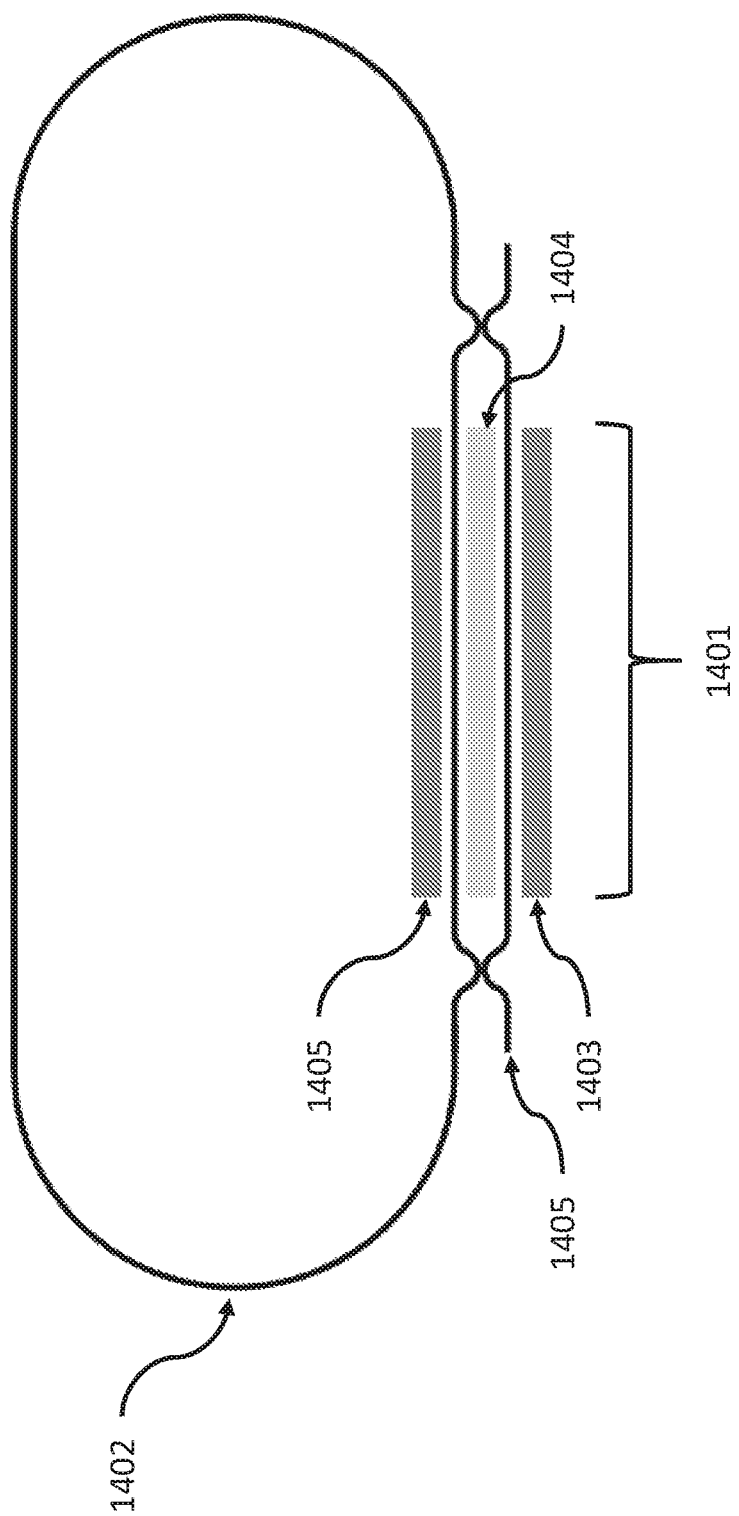
FIG. 14 is a schematic diagram of a device for light storage according to embodiments of the present disclosure.

Referring to FIG. 14, a schematic diagram is provide of a device for light storage according to embodiments of the present disclosure. In FIG. 14, instead of a two ring resonators as in various embodiments described above, a Mach-Zehnder interferometer 1401 is configured as a coupler to resonator 1402. In this configuration, electrodes 1403, 1404, 1405 are used to temporarily enable or disable coupling of ring 1402 to external waveguide 1405. In exemplary embodiments, the electrodes have a ground-signal-ground configuration, yielding an opposite phase shift for a given applied electrical signal. The Mach-Zehnder configuration allows changing the ratio of the light in the two legs of Mach-Zehnder interferometer 1401.

Various exemplary embodiments described herein use lithium niobate for resonators and waveguides. However, it will be appreciated that a variety of eletrco-optic materials may be used in place of lithium niobate, such as lithium tantalate. In general, any materials with an electro-optic coefficient >2 μm/V is suitable.

Various exemplary embodiments described herein rely on ring resonators. However, it will be appreciated that alternative resonator configurations may be substituted for one or more of the ring resonators in various embodiments. For example, a racetrack resonator may be used.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device comprising:
   a waveguide;
   a first ring resonator;
   a second ring resonator, the second ring resonator evanescently coupled to the first ring resonator and to the waveguide;
   a first pair of electrodes, one of the first pair of electrodes disposed within the first ring resonator and the other of the first pair of electrodes disposed without the first ring resonator;
   a second pair of electrodes, one of the second pair of electrodes disposed within the second ring resonator and the other of the second pair of electrodes disposed without the second ring resonator;
   a microwave source electrically coupled to the first and second pairs of electrodes;
   a bias port electrically coupled to the first and second pairs of electrodes and configured to sweep a frequency band.

2. The device of claim 1, wherein the first ring resonator and/or the second ring resonator comprise lithium niobate or lithium tantalate.

3. The device of claim 1, wherein the first ring resonator and/or the second ring resonator comprise an electro-optic material.

4. The device of claim 1, wherein the first ring resonator and/or the second ring resonator have radii of 10 μm to 3000 μm.

5. The device of claim 1, wherein the first ring resonator has a radius different from a radius of the second ring resonator.

6. The device of claim 1, wherein the electrodes have electrical bandwidth of at least 2 GHz.

7. The device of claim 1, having a modulation efficiency of at least 0.1 GHz/V.

8. The device of claim 1, wherein the first ring resonator and/or the second ring resonator have a photon-life time of at least 2ns.

9. The device of claim 8, wherein the first and second ring resonators are separated by a gap having a width of about 500nm.

10. The device of claim 1, wherein the first and second ring resonators are optically coupled with an optical coupling strength of at least 0.5 GHz.

11. The device of claim 1, wherein the first ring resonator and/or the second ring resonator have a Q factor of at least $1 \times 10^4$.

12. The device of claim 1, wherein the first pair of electrodes and or the second pair of electrodes comprise gold or copper.

13. The device of claim 1, wherein each of the first pair of electrodes is from 1 μm to 10 μm away from the first ring resonator.

14. The device of claim 1, wherein each of the second pair of electrodes is from 1 μm to 10 μm away from the second ring resonator.

15. The device of claim 1, wherein the bias port is adapted to apply a voltage in the range of ±15V.

16. The device of claim 1, wherein the first ring resonator and/or the second ring resonator have a cross-sectional width of about 1.4 μm.

17. The device of claim 1, wherein the waveguide has a cross-sectional width of about 800nm.

18. The device of claim 1, wherein the waveguide has a cross-sectional height of about 600nm.

19. The device of claim 18, wherein the slab portion has a thickness of about 250nm.

20. The device of claim 18, wherein the height of the ridge portion is about 350nm.

21. The device of claim 18, wherein the width of the ridge portion is 1300nm to 1500nm.

22. The device of claim 18, wherein the ridge portion has a cross-sectional are of at most 5 µm$^2$.

23. The device of claim 1, wherein the first ring resonator or the second ring resonator comprises a ridge portion extending from a slab portion, the ridge portion having a height perpendicular to the slab portion and a width parallel to the slab portion.

24. The device of claim 1, further comprising an inductor electrically coupled to the first and second pairs of electrodes.

25. The device of claim 1, wherein the inductor comprises a superconductor.

26. The device of claim 1, wherein the microwave source is configured to drive the first and second pairs of electrodes in a pulsed regime.

27. The device of claim 26, wherein a pulse duration of the microwave source is less than twice a photon lifetime of the first or second ring resonator.

28. A device comprising:
a waveguide;
a first resonator;
a second resonator, the second resonator optically coupled to the first resonator and to the waveguide;
a first pair of electrodes, the first pair of electrodes disposed along one of the first or second resonator with at least a portion of said one of the first or second resonator disposed between the first pair of electrodes;
a microwave source electrically coupled to the first pair of electrodes;
a bias port electrically coupled to the first pair of electrodes and configured to sweep a frequency band; and
a second pair of electrodes, the second pair of electrodes disposed along another of the first or second resonator with at least a portion of said another of the first or second resonator disposed between the second pair of electrodes, wherein
the microwave source is electrically coupled to the second pair of electrodes,
the bias port is electrically coupled to the second pair of electrodes.

29. The device of claim 28, further comprising:
a second pair of electrodes, the second pair of electrodes disposed along another of the first or second resonator with at least a portion of said another of the first or second resonator disposed between the second pair of electrodes, wherein
the microwave source is electrically coupled to the second pair of electrodes.

30. The device of claim 28, wherein the first resonator and/or the second resonator comprises a ring resonator.

31. The device of claim 30, wherein the first ring resonator and/or the second ring resonator have radii of 10 µm to 3000 µm.

32. The device of claim 30, wherein the first ring resonator has a radius different from a radius of the second ring resonator.

33. The device of claim 28, wherein the first resonator and/or the second resonator comprises a racetrack resonator.

34. The device of claim 28, wherein the first ring resonator and/or the second ring resonator comprise lithium niobate or lithium tantalate.

35. The device of claim 28, wherein the first ring resonator and/or the second ring resonator comprise an electro-optic material.

36. The device of claim 28, wherein the electrodes have electrical bandwidth of at least 2 GHz.

37. The device of claim 28, having a modulation efficiency of at least 0.1 GHz/V.

38. he device of claim 28, wherein the first ring resonator and/or the second ring resonator have a photon-life time of at least 2ns.

39. The device of claim 28, wherein the first and second ring resonators are optically coupled with an optical coupling strength of at least 0.5 GHz.

40. The device of claim 39, wherein the first and second ring resonators are separated by a gap having a width of about 500nm.

41. The device of claim 28, wherein the first ring resonator and/or the second ring resonator have a Q factor of at least 1×10$^4$.

42. The device of claim 28, wherein the first pair of electrodes and or the second pair of electrodes comprise gold or copper.

43. The device of claim 28, wherein each of the first pair of electrodes is from 1 µm to 10 µm away from the first ring resonator.

44. The device of claim 28, wherein each of the second pair of electrodes is from 1 µm to 10 µm away from the second ring resonator.

45. The device of claim 28, wherein the bias port is adapted to apply a voltage in the range of ±15V.

46. The device of claim 28, wherein the first ring resonator and/or the second ring resonator have a cross-sectional width of about 1.4 µm.

47. The device of claim 28, wherein the waveguide has a cross-sectional width of about 800nm.

48. The device of claim 28, wherein the waveguide has a cross-sectional height of about 600nm.

49. The device of claim 28, wherein the first ring resonator or the second ring resonator comprises a ridge portion extending from a slab portion, the ridge portion having a height perpendicular to the slab portion and a width parallel to the slab portion.

50. The device of claim 49, wherein the slab portion has a thickness of about 250nm.

51. The device of claim 49, wherein the height of the ridge portion is about 350nm.

52. The device of claim 49, wherein the width of the ridge portion is 1300nm to 1500nm.

53. The device of claim 49, wherein the ridge portion has a cross-sectional are of at most 5 µm$^2$.

54. The device of claim 28, further comprising an inductor electrically coupled to the first and second pairs of electrodes.

55. The device of claim 28, wherein the inductor comprises a superconductor.

56. The device of claim 28, wherein the microwave source is configured to drive the first and second pairs of electrodes in a pulsed regime.

57. The device of claim 56, wherein a pulse duration of the microwave source is less than twice a photon lifetime of the first or second ring resonator.

* * * * *

UNITED STATES PATENT AND TRADEMARK OFFICE
CERTIFICATE OF CORRECTION

PATENT NO. : 11,429,009 B2
APPLICATION NO. : 17/052054
DATED : August 30, 2022
INVENTOR(S) : Mian Zhang, Marko Loncar and Cheng Wang Page 1 of 1

It is certified that error appears in the above-identified patent and that said Letters Patent is hereby corrected as shown below:

In the Specification

Paragraph 2 should read:
"GOVERNMENT SUPPORT CLAUSE
This invention was made with government support under 1609549 awarded by National Science Foundation (NSF). The government has certain rights in this invention."

Signed and Sealed this
Twenty-eighth Day of October, 2025

John A. Squires
*Director of the United States Patent and Trademark Office*